(12) United States Patent
Maeta

(10) Patent No.: US 10,886,397 B2
(45) Date of Patent: Jan. 5, 2021

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Ryo Maeta, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 21 days.

(21) Appl. No.: 16/169,040

(22) Filed: Oct. 24, 2018

(65) Prior Publication Data

US 2019/0181260 A1 Jun. 13, 2019

(30) Foreign Application Priority Data

Dec. 7, 2017 (JP) ................. 2017-235612

(51) Int. Cl.
| | |
|---|---|
| *H01L 29/78* | (2006.01) |
| *H01L 29/06* | (2006.01) |
| *H01L 29/66* | (2006.01) |
| *H01L 29/423* | (2006.01) |
| *H01L 29/739* | (2006.01) |
| *H01L 29/10* | (2006.01) |
| *H01L 21/761* | (2006.01) |
| *H01L 21/02* | (2006.01) |

(52) U.S. Cl.
CPC ...... *H01L 29/7811* (2013.01); *H01L 29/0619* (2013.01); *H01L 29/0634* (2013.01); *H01L 29/0638* (2013.01); *H01L 29/1095* (2013.01); *H01L 29/66333* (2013.01); *H01L 29/66712* (2013.01); *H01L 29/7395* (2013.01); *H01L 29/7802* (2013.01); *H01L 29/7813* (2013.01)

(58) Field of Classification Search
CPC ..... H01L 21/845; H01L 21/761; H01L 21/02; H01L 29/0619
See application file for complete search history.

(56) References Cited

U.S. PATENT DOCUMENTS

| | | | |
|---|---|---|---|
| 2001/0028083 A1* | 10/2001 | Onishi | ................ H01L 29/0634 257/328 |
| 2003/0222327 A1 | 12/2003 | Yamaguchi et al. | |
| 2004/0124465 A1 | 7/2004 | Onishi et al. | |

(Continued)

FOREIGN PATENT DOCUMENTS

| | | |
|---|---|---|
| JP | 2001-298190 A | 10/2001 |
| JP | 2003-273355 A | 9/2003 |

*Primary Examiner* — Omar F Mojaddedi

(57) ABSTRACT

A semiconductor device has an active region through which current flows and a termination structure region. At a front surface of a semiconductor substrate of a first conductivity type, a first semiconductor layer of the first conductivity type is provided. At a surface of the first semiconductor layer, a lower parallel pn structure is provided. At a surface of the lower parallel pn structure, an upper parallel pn structure is provided in the termination structure region and a first semiconductor region of a second conductivity type is provided in the active region. A width of an upper second column is wider than a width of a lower second column. An interval between the upper second columns is wider than an interval between the lower second columns. A thickness of the upper second column is thicker than a thickness of the first semiconductor region.

4 Claims, 16 Drawing Sheets

(56) References Cited

U.S. PATENT DOCUMENTS

| | | |
|---|---|---|
| 2005/0017292 A1 | 1/2005 | Onishi et al. |
| 2005/0098826 A1 | 5/2005 | Yamaguchi et al. |
| 2007/0138543 A1* | 6/2007 | Saito ................... H01L 29/0634 257/328 |
| 2010/0078775 A1* | 4/2010 | Mauder ............... H01L 29/1095 257/655 |
| 2012/0273916 A1* | 11/2012 | Yedinak .............. H01L 29/0634 257/471 |

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-235612, filed on Dec. 7, 2017, the entire contents of which are incorporated herein by reference.

BACKGROUND

1. Field

Embodiments of the invention relate to a semiconductor device a method of manufacturing a semiconductor device

2. Description of Related Art

In an ordinary n-type channel, vertical metal oxide semiconductor field effect transistor (MOSFET), among plural semiconductor layers formed on a semiconductor substrate, an n-type conductive layer (drift layer) is the semiconductor layer having a highest resistance. Electrical resistance of this n-type drift layer significantly affects ON resistance of the vertical MOSFET overall. Reduction of the ON resistance of the vertical MOSFET overall may be realized by reducing a thickness of the n-type drift layer and shortening a current path.

The vertical MOSFET has a further function of sustaining a breakdown voltage by a spreading of a depletion layer to the high-resistance n-type drift layer in an OFF state. Therefore, when the n-type drift layer is made thinner to reduce the ON resistance, the spread of the depletion layer in the OFF state becomes shorter, whereby critical electric field strength tends to be reached by a low applied voltage and the breakdown voltage decreases. Meanwhile, to increase the breakdown voltage of the vertical MOSFET, the thickness of the n-type drift layer has to be increased, whereby the ON resistance increases. Such a relationship between the ON resistance and the breakdown voltage is called a tradeoff relationship and concurrent enhancement of both members of such a tradeoff relationship is generally difficult. The tradeoff relationship of the ON resistance and the breakdown voltage is known to similarly occur in other semiconductor devices like insulated gate bipolar transistors (IGBTs), bipolar transistors, diodes, etc.

A superjunction (SJ) structure is known as a semiconductor device structure that addresses this problem. For example, a MOSFET (hereinafter, SJ-MOSFET) having a superjunction structure is known. FIG. 24 is a cross-sectional view of a structure of a conventional SJ-MOSFET at cutting line A-A' in FIG. 25. FIG. 25 is a top view of the structure of the conventional SJ-MOSFET. FIG. 25 is a top view as viewed from a top (source electrode 1010 side) in a state without an oxide film 1013 depicted in FIG. 24.

As depicted in FIG. 24, SJ-MOSFET uses as a material, a wafer in which an n$^-$-type drift layer 102 is grown on an n$^+$-type semiconductor substrate 101 having a high impurity concentration. A p-type column region 104 is provided from a surface of the wafer. The p-type column region 104 penetrates the n$^-$-type drift layer 102 and does not reach the n$^+$-type semiconductor substrate 101. In FIG. 24, although the p-type column region 104 does not reach the n$^+$-type semiconductor substrate 101, the p-type column region 104 may reach the n$^+$-type semiconductor substrate 101.

Further, the SJ-MOSFET has in the n$^-$-type drift layer 102, a parallel structure (hereinafter, parallel pn region 1019) in which a p-type region (the p-type column region 104) extending along a direction orthogonal to a substrate main surface and having a narrow width in a plane parallel to the substrate main surface, and an n-type region (a portion of the n$^-$-type drift layer 102 sandwiched by the p-type column region 104, hereinafter, n-type column region 103) are arranged to alternate repeatedly in a plane parallel to the substrate main surface. The p-type column regions 104 and the n-type column regions 103 constituting the parallel pn region 1019 are regions of increased impurity concentrations according to the n$^-$-type drift layer 102. In the parallel pn region 1019, impurity concentrations of the p-type column regions 104 and the n-type column regions 103 are substantially equal, enabling in the OFF state, a pseudo non-doped layer to be created, facilitating a high breakdown voltage.

A p$^+$-type base region 105 is provided on the parallel pn region 1019 of an active region 1200 of the SJ-MOSFET, the active region 1200 being a region in which an element is formed and through which current flows during an ON state. An n$^+$-type source region 106 is provided in the p$^+$-type base region 105. Further, a gate insulating film 107 is provided across surfaces of the p$^+$-type base region 105 and the n-type column region 103. A gate electrode 108 is provided on a surface of the gate insulating film 107, and an interlayer insulating film 9 is provided so as to cover the gate electrode 108. Further, the source electrode 1010 is provided on the n$^+$-type source region 106, and a drain electrode (not depicted) is provided on a rear surface of the n$^+$-type semiconductor substrate 101.

As depicted in FIGS. 24 and 25, in a termination region 1300 of the SJ-MOSFET, the termination region 1300 surrounding the active region 1200, an n$^+$-type region 1012 functioning as a channel stopper is formed in the n$^+$-type drift layer 102. The oxide film 1013 is provided on the n$^-$-type drift layer 102, similarly in the active region 200, and is provided on a parallel pn region 1020 and the n$^+$-type region 1012. The drain electrode (not depicted) is provided on the rear surface of the n$^+$-type semiconductor substrate 101.

Further, in a power semiconductor element, the termination region 1300 has to sustain a breakdown voltage similarly to the active region 1200. To obtain high breakdown voltage in the termination region 1300, a structure in which a field plate, RESURF, guard ring, etc. is formed is a commonly known art. According to a related art, in an element having a parallel pn region, a pitch of the parallel pn region 1020 in the termination region 1300 is narrower than a pitch of the parallel pn region 1019 in the active region 1200 (for example, refer to Japanese Laid-Open Patent Publication No. 2001-298190). Here, a pitch is a width W that is a sum of a width of the p-type column region 104 and a width of the n-type column region 103 adjacent thereto of the parallel pn region 1019, the pitch also being called a repeat pitch. With such a configuration, an impurity concentration of the termination region 1300 becomes lower than an impurity concentration of the active region 1200, enabling the breakdown voltage of the termination region 1300 to be enhanced.

Further, according to another technique, in an element having a parallel pn region, a p-type drift layer is also provided in a junction termination region part and connected to a p-type guard ring layer selectively provided at a surface of an n-type base layer (for example, refer Japanese Laid- Open Patent Publication No. 2003-273355). Thus, equipotential lines spreading in the junction termination region part become smooth, thereby obtaining a high, stable breakdown voltage. As a result, decreases in the breakdown voltage at the junction termination region part are suppressed.

SUMMARY

According to one aspect of the present invention, a semiconductor device includes an active region through which current flows; a termination structure region disposed outside the active region and in which a termination structure is provided surrounding a periphery of the active region: a first semiconductor layer of a first conductivity type provided at a front surface of a semiconductor substrate of a first conductivity type, the first semiconductor layer having an impurity concentration that is lower than an impurity concentration of the semiconductor substrate; a lower parallel pn structure provided at a surface of the first semiconductor layer and in which a lower first column of the first conductivity type and a lower second column of a second conductivity type are disposed to alternate repeatedly in a plane parallel to the front surface; an upper parallel pn structure provided at a surface of the lower parallel pn structure in the termination structure region and in which an upper first column of the first conductivity type and an upper second column of the second conductivity type and electrically connected with the lower second column are disposed to alternate repeatedly in a plane parallel to the front surface; and a first semiconductor region of the second conductivity type and provided at a surface of the lower parallel pn structure in the active region. A width of the upper second column is wider than a width of the lower second column, and an interval between the upper second columns is wider than an interval between the lower second columns. A thickness of the upper second column is thicker than a thickness of the first semiconductor region.

In the embodiment, the thickness of the upper second column is 2.5 times to 6 times the thickness of the first semiconductor region.

In the embodiment, the width of the upper second column is 1.25 times to 3 times the width of the lower second column. The interval between the upper second columns is at least 1.25 times and less than 3 times the interval between the lower second columns.

In the embodiment, the upper second column has a ring-shape surrounding the active region.

According to another embodiment, a method of manufacturing a semiconductor device including an active region through which current flows and a termination structure region disposed outside the active region and in which a termination structure is provided surrounding a periphery of the active region, includes forming a first semiconductor layer of a first conductivity type on a front surface of a semiconductor substrate of the first conductivity type, the first semiconductor layer having an impurity concentration that is lower than an impurity concentration of the semiconductor substrate; forming a lower parallel pn structure at a surface of the first semiconductor layer and in which a lower first column of the first conductivity type and a lower second column of a second conductivity type are disposed to alternate repeatedly in a plane parallel to the front surface; forming an upper parallel pn structure at a surface of the lower parallel pn structure in the termination structure region and in which an upper first column of the first conductivity type and an upper second column of the second conductivity type and electrically connected with the lower second column are disposed to alternate repeatedly in a plane parallel to the front surface; and forming a first semiconductor region of the second conductivity type at the surface of the lower parallel pn structure in the active region, wherein forming the upper parallel pn structure includes forming the upper second column to have a width wider than a width of the lower second column and forming the upper second column at an interval wider than an interval between the lower second columns, forming the upper second column to have a thickness thicker than a thickness of the first semiconductor region.

In the embodiment, forming the lower parallel pn structure includes forming the lower parallel pn structure by repeatedly performing epitaxial growth and ion implantation. Forming the upper parallel pn structure includes forming the upper parallel pn structure by repeatedly performing epitaxial growth and ion implantation.

In the embodiment, forming the lower parallel pn structure includes forming the lower parallel pn structure by forming a trench and embedding an impurity of the first conductivity type or the second conductivity type in the trench. Forming the upper parallel pn structure includes forming the upper parallel pn structure by forming a trench and embedding an impurity of the first conductivity type or the second conductivity type in the trench.

In the embodiment, forming the upper parallel pn structure includes using a mask having openings of a width that is 1 time to 1.2 times a width of openings of a mask used in forming the lower parallel pn structure.

Objects, features, and advantages of the present invention are specifically set forth in or will become apparent from the following detailed description of the invention when read in conjunction with the accompanying drawings.

DESCRIPTION OF EMBODIMENTS

Figure 1:
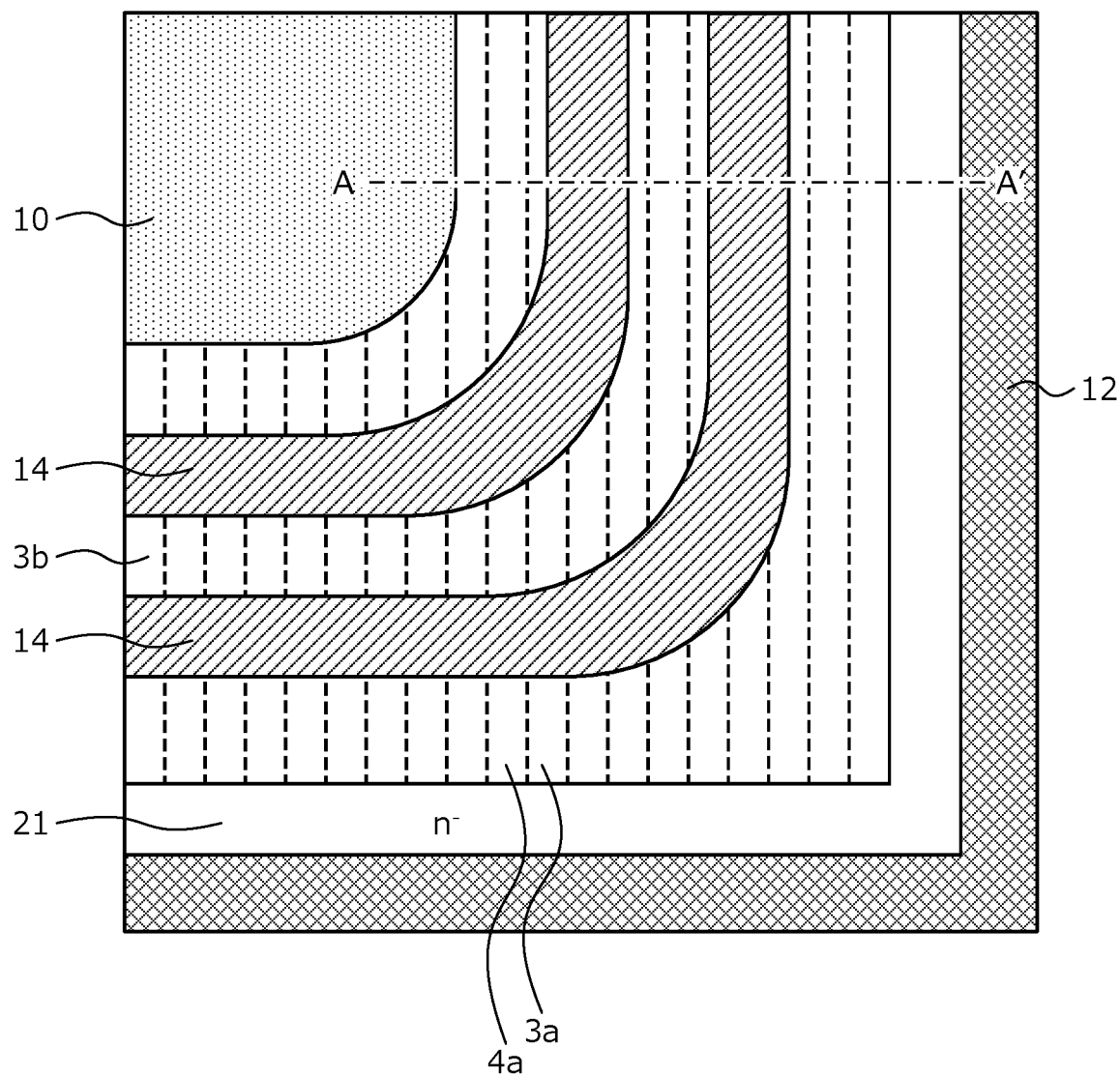
FIG. 1 is a top view of a structure of a SJ-MOSFET according to a first embodiment.

First, problems associated with the related arts will be described. In the structure described in Japanese Laid-Open Patent Publication No. 2001-298190, a depletion layer spreads easily in a lateral direction (toward the n+-type region 1012) from the active region 1200 and does not spread easily in a longitudinal direction (toward the n+-type semiconductor substrate 101). Thus, equipotential lines are densely distributed in the lateral direction, while equipotential lines are spread out in the longitudinal direction as compared to in the lateral direction, whereby the breakdown voltage sustained in the longitudinal direction is reduced and the breakdown voltage of the termination region 1300 decreases. Therefore, to meet a target breakdown voltage, a need to increase a length of the termination region 1300 arises.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 2:
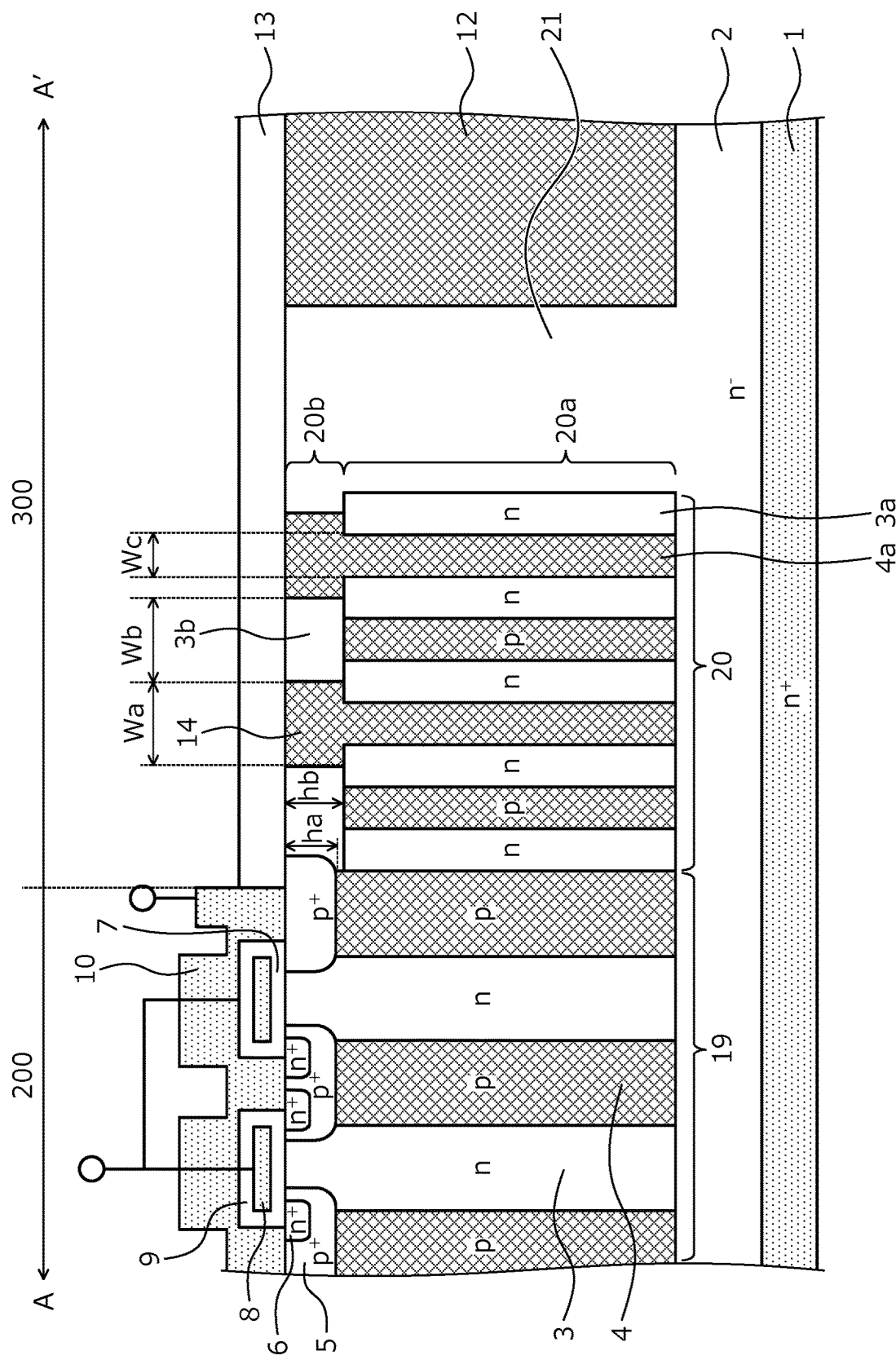
FIG. 2 is a cross-sectional view along cutting line A-A' in FIG. 1 depicting the structure of the SJ-MOSFET according to the first embodiment.

A semiconductor device according to an embodiment of the present invention will be described taking a SJ-MOSFET as an example. FIG. 1 is a top view of a structure of a SJ-MOSFET according to a first embodiment. Further, FIG. 1 is a top view as viewed from an upper side (source electrode 10 side) in a state without an oxide film 13 and a p+-type base region 5 in FIG. 2. FIG. 2 is a cross-sectional view along cutting line A-A' in FIG. 1 depicting the structure of the SJ-MOSFET according to the first embodiment.

The SJ-MOSFET depicted in FIG. 2 is a SJ-MOSFET having a metal oxide semiconductor (MOS) gate in an upper portion (portion including at least a front surface and a p+-type base region 5) of a semiconductor base (silicon base: semiconductor chip) containing silicon (Si). The SJ-MOSFET has an active region 200 and a termination region 300 that surrounds a periphery of the active region 200. The active region 200 is a region in which current flows during an ON state. The termination region 300 is a region that mitigates electric field of a base front surface side of a drift region. In FIG. 2, in the active region 200, only two unit cells (functional units of an element) are depicted and unit cells adjacent to the two unit cells are not depicted. A boundary of the active region 200 and the termination region 300 is a terminus face of the source electrode 10.

An n+-type semiconductor substrate (semiconductor substrate of a first conductivity type) 1 is a single crystal silicon substrate doped with, for example, phosphorus (P). An n−-type drift layer (first semiconductor layer of the first conductivity type) 2 is a low-concentration n−-type drift layer that has an impurity concentration lower than an impurity concentration of the n+-type semiconductor substrate 1 and that is doped with, for example, phosphorus. Hereinafter, the n+-type semiconductor substrate 1 and the n+-type drift layer 2 collectively are regarded as the semiconductor base. In the upper portion of the semiconductor base, the MOS gate (insulated gate using a metal-oxide film-semiconductor material) structure (element structure) is formed. Further, at a rear surface of the semiconductor base, a drain electrode (not depicted) is provided.

In the active region 200 of the SJ-MOSFET, a parallel pn region 19 is provided, hi the parallel pn region 19, an n-type column region 3 and a p-type column region 4 are arranged to alternate repeatedly. The p-type column region 4 is provided from a surface of the n−-type drift layer 2 and does not reach a surface of the n+-type semiconductor substrate 1. A planar shape of the n-type column regions 3 and the p-type column regions 4 is, for example, a striped shape. Cutting line A-A' depicted in FIG. 1 represents a cross-section of the n-type column regions 3 and the p-type column regions 4, orthogonal to a length direction.

Further, the p+-type base region 5 is provided in a surface layer of the p-type column region 4 and an n+-type source region 6 is provided in a surface layer of the p+-type base region 5. On a surface of a portion of the p+-type base region 5 between the n+-type source region 6 and the n-type column region 3, a gate electrode 8 is provided via a gate insulating film 7. The gate electrode 8 may be provided on a surface of the n-type column region 3 via the gate insulating film 7.

An interlayer insulating film 9 is provided at a front surface side of the semiconductor base so as to cover the gate electrode 8. The source electrode 10 is in contact with the n+-type source region 6 and the p+-type base region 5 via a contact hole opened in the interlayer insulating film 9, and is electrically connected to the n+-type source region 6 and the p+-type base region 5.

The source electrode 10 is electrically insulated from the gate electrode 10 by the interlayer insulating film 9. A protective film (not depicted) such as a passivation film containing, for example, polyimide is selectively provided on the source electrode 10.

In the termination region 300 of the SJ-MOSFET, a parallel pn region 20 is selectively provided. Outside the parallel pn region 20, an n⁻-type layer 21 having an impurity concentration lower than an impurity concentration of the type drift layer 2 is provided so as to surround the parallel pn region 20. Outside the n⁻-type layer 21, an n⁺-type region (first semiconductor region of the first conductivity type) 12 functioning as a channel stopper is provided so as to surround the n⁻-type layer 21. The oxide film 13 is provided on surfaces of the parallel pn region 20, the n⁻-type layer 21, and the n⁺-type region 12. The impurity concentration of the n⁻-type layer 21 may be equal to the impurity concentration of the n⁻-type drift layer 2.

At the parallel pn region 20 in the termination region 300, an upper p-type layer ring 14 and an n-type column region 3b are provided at an upper side (side toward the oxide film 13) of the region. A repeat pitch (a width that is a sum of a width of a p-type layer ring and a width of the n-type column region) of the upper p-type layer ring 14 and the n-type column region 3b is larger than that of other layers and, in particular, is as follows. The parallel pn region 20 in the termination region 300 is constituted by a lower parallel pn region 20a and an upper parallel pn region 20b sequentially from a surface of the n⁻-type drift layer 2. In the lower parallel pn region 20a, a lower n-type column region 3a and a lower p-type column region 4a are disposed to alternate repeatedly in a plane parallel to the n⁺-type semiconductor substrate 1. In the upper parallel pn region 20b, the n-type column region 3b and the upper p-type layer ring 14 are disposed to alternate repeatedly in a plane parallel to the n⁺-type semiconductor substrate 1. Hereinafter, the parallel pn region 20 in the termination region 300 will be referred to as simply, the parallel pn region 20.

Here, the upper p-type layer ring 14 is a ring provided so as to surround the active region 200 and a width Wa of the ring is wider than a width Wc of the lower p-type column region 4a. In particular, the width Wa of the ring is 1.25 times to 3.0 times the width Wc of the lower p-type column region 4a. Further, an interval Wb (corresponds to a width of the n-type column region 3b) between the upper p-type layer rings 14 is wider than an interval (corresponds to a width of the lower n-type column region 3a) between the lower p-type column regions 4a. In particular, the interval Wb between the rings is 1.25 times to 3.0 times the interval between the lower p-type column regions 4a.

Further, the lower n-type column region 3a and the lower p-type column region 4a have the same width. A planar shape of the lower n-type column region 3a and the n-type column region 3b, for example, is striped. The length direction of the n-type column regions 3 and the p-type column regions 4 in the parallel pn region 19 is oriented so as to be parallel to the length direction of the lower n-type column regions 3a, the n-type column regions 3b (hereinafter, n type column regions of the parallel pn region 20), and the lower p-type column regions 4a (hereinafter, p-type column regions of the parallel pn region 20) in the parallel pn region 20.

The width of the lower n-type column region 3a and the lower p-type column region 4a may be in a range from 3 μm to 5 μm and, for example, is 4 μm. Further, widths of the n-type column region 3b and the upper p-type layer ring 14 may be in a range from 6 μm to 14 μm and, for example, is 10 μm.

Further, the upper parallel pn region 20b may have a repeat pitch that is about 2 times wider than that of the lower parallel pn region 20a. When the repeat pitch is 2 times wider, as depicted in FIG. 2, the respective p-type column regions of an upper pn region (e.g., the upper parallel pn region 20b) and a lower pn region (e.g., the lower parallel pn region 20a) become arranged periodically, equipotential lines enter evenly, obtaining the most effective improvement of breakdown voltage.

Further, the repeat pitch of the upper parallel pn region 20b may be constant. In other words, the interval between the upper p-type layer rings 14 is constant on the inner side (the active region 200) and on the peripheral side (the termination region 300). For example, when the repeat pitch on the inner side is reduced and density of the upper p-type layer ring 14 is increased, electric field may concentrate at the inner side and the breakdown voltage may decrease. Therefore, in the embodiment, the repeat pitch is made constant, the equipotential lines are made uniform, local generation of a strong part of the electric field is prevented, and breakdown voltage of the termination region 300 is enhanced.

Further, a film thickness hb of the upper parallel pn region 20b is greater than a film thickness ha of the p⁺-type base region 5. For example, the film thickness hb of the upper parallel pn region 20b may be 2.5 times to 6 times the film thickness ha of the p⁺-type base region 5. In this manner, the film thickness hb is made thicker than the film thickness ha, whereby the equipotential lines may be caused to extend downwardly, whereby a portion (a region S in FIG. 3 described hereinafter) not conventionally used also contributes to improving the breakdown voltage. Therefore, the breakdown voltage of the termination region 300 may be enhanced.

In the parallel pn region 20 having a striped planar shape, in a region where a width direction of the lower p-type column regions 4a and the length direction of the upper p-type layer rings 14 become parallel, the lower p-type column regions 4a and the upper p-type layer rings 14 are electrically connected. Further, positions of the p-type column regions are made to differ in a horizontal direction, whereby depletion in a column in an oblique direction is suppressed, enabling the breakdown voltage to be improved. On the other hand, when the p-type column regions are provided at the same position, the amount of increase of the breakdown voltage is less.

Figure 3:
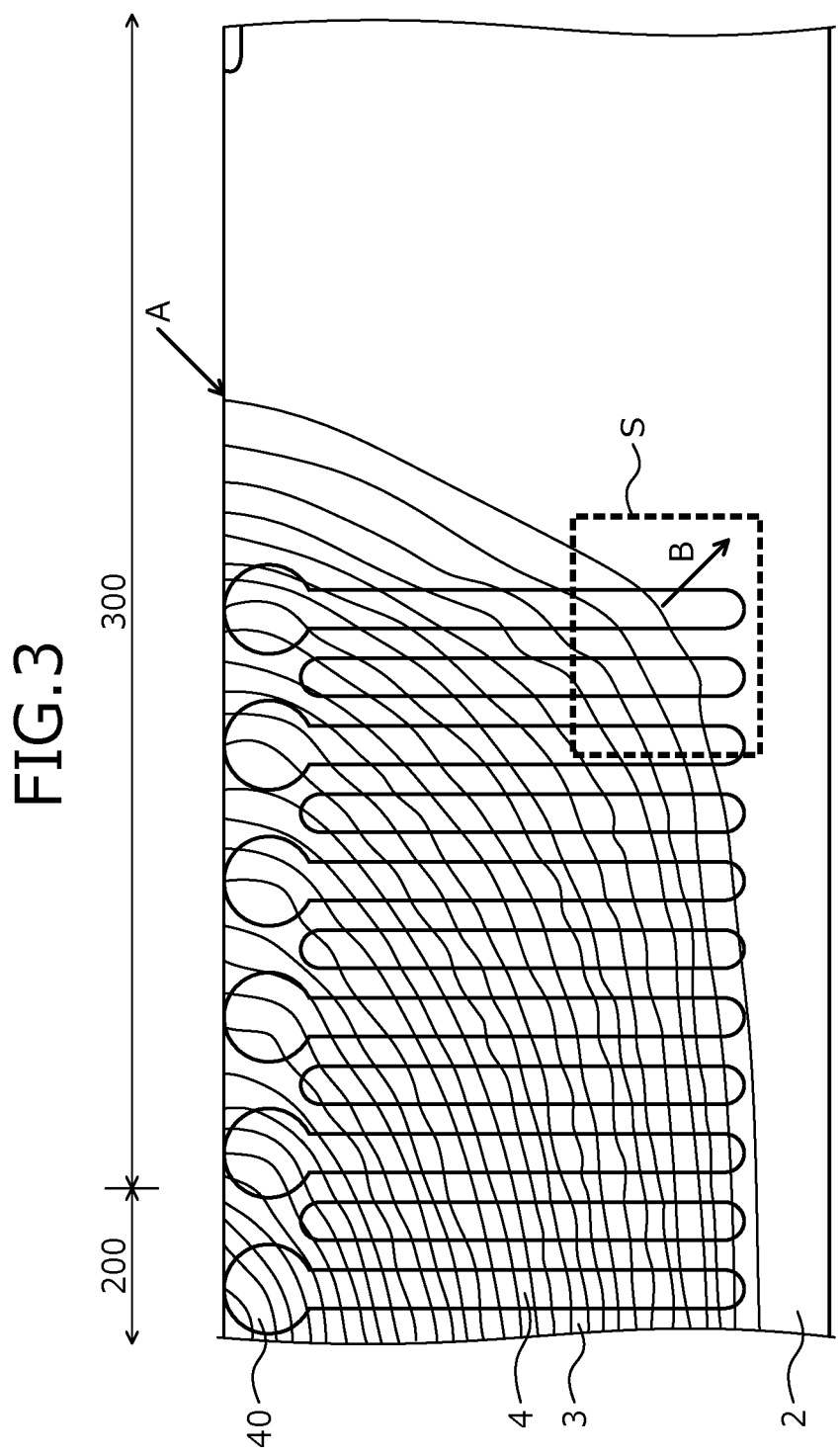
FIG. 3 is a cross-sectional view of equipotential lines of the SJ-MOSFET according to the first embodiment.
Figure 4:
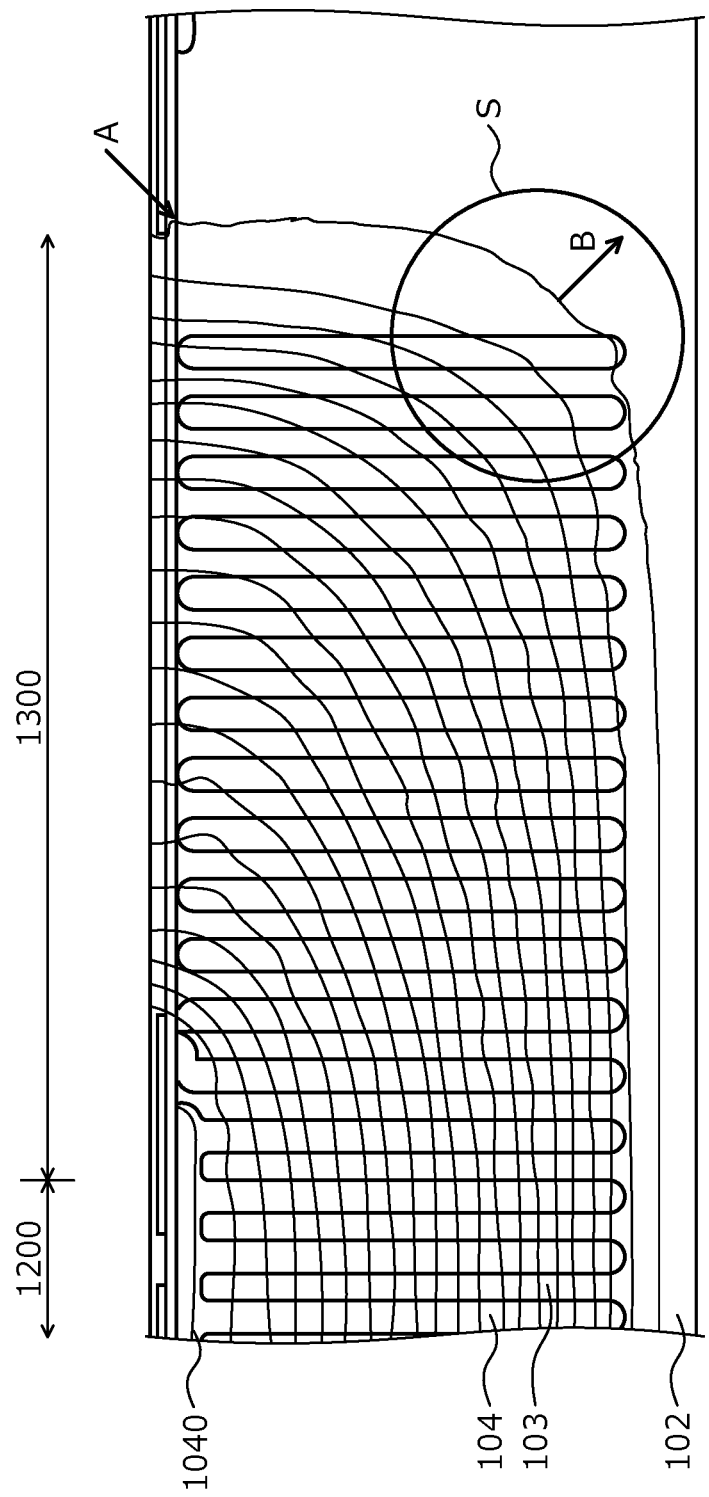
FIG. 4 is a cross-sectional view of equipotential lines a conventional SJ-MOSFET.

FIG. 3 is a cross-sectional view of equipotential lines of the SJ-MOSFET according to the first embodiment. FIG. 4 is a cross-sectional view of equipotential lines the conventional SJ-MOSFET. Both FIGS. 3 and 4 depict equipotential lines 40 in a state in which a constant current flows in the SJ-MOSFETs having the termination regions 300, 1300 of a same length. As depicted in FIGS. 3 and 4, at a same position A in the termination regions 300, 1300, voltage of the equipotential line of the SJ-MOSFET according to the embodiment is higher than that of the equipotential line of the conventional SJ-MOSFET.

Figure 5:
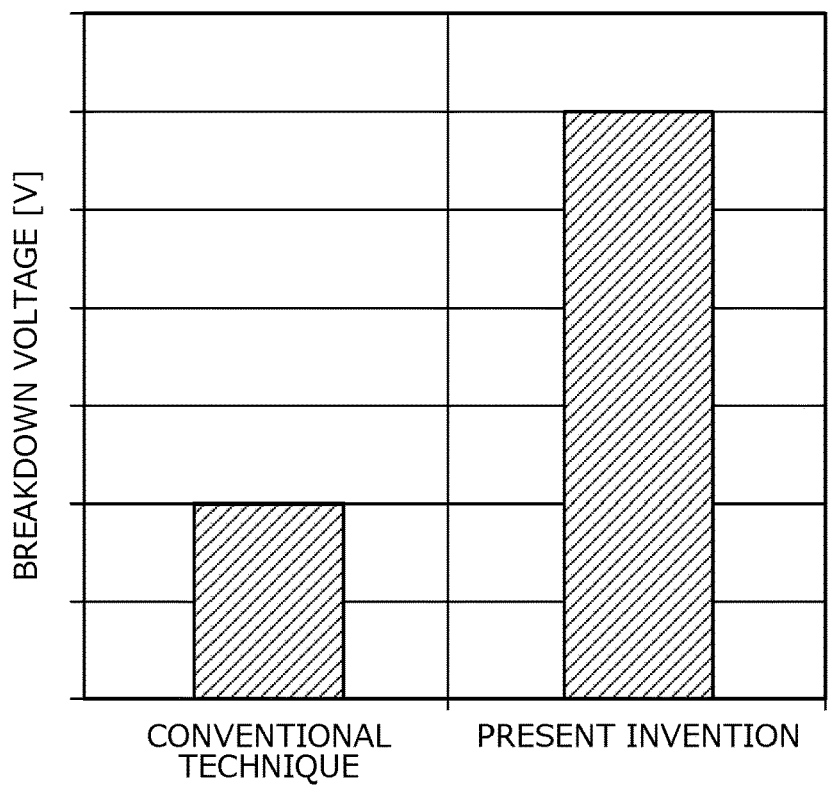
FIG. 5 is a graph comparing breakdown voltage of the SJ-MOSFET according to the first embodiment and breakdown voltage of the conventional SJ-MOSFET.

FIG. 5 is a graph comparing breakdown voltage of the SJ-MOSFET according to the first embodiment and breakdown voltage of the conventional SJ-MOSFET. In FIG. 5, a vertical axis represents breakdown voltage in units of V. As depicted in FIG. 5, the breakdown voltage of the SJ-MOSFET according to the first embodiment is higher than that of the conventional SJ-MOSFET. In this manner, the SJ-MOSFET according to the embodiment may improve breakdown voltage for the termination region 300 of the same length as the termination region 1300. Further, when the same breakdown voltage is to be realized, the SJ-MOSFET according to the first embodiment enables the length of the termination region 300 to be shorter than the length of the termination region 1300 of the conventional SJ-MOSFET.

A reason for this is as follows. In the conventional SJ-MOSFET, the depletion layer spreads in a lateral direction and thereafter, spreads in a depth direction. Therefore, a portion, a region S depicted in FIG. 3, does not contribute to improvement of the breakdown voltage. On the other hand, in the SJ-MOSFET according to the first embodiment, the depletion layer does not spread easily through the upper parallel pn region 20b and therefore, the depletion layer spreads in the lateral direction and the depth direction concurrently, whereby the depletion layer spreads in square shape and the portion (the region S in FIG. 3) not used conventionally comes to contribute to improving the breakdown voltage. Thus, in the SJ-MOSFET according to the first embodiment, the equipotential lines 40 do not overhang in a direction indicated by arrow B, whereby the density of the equipotential lines 40 increases. In this manner, in the SJ-MOSFET according to the first embodiment, a portion not conventionally used contributes to the breakdown voltage, thereby increasing the density of the equipotential lines and enabling the breakdown voltage to be improved with the termination region 300 of the same length as that conventionally.

Figure 6:
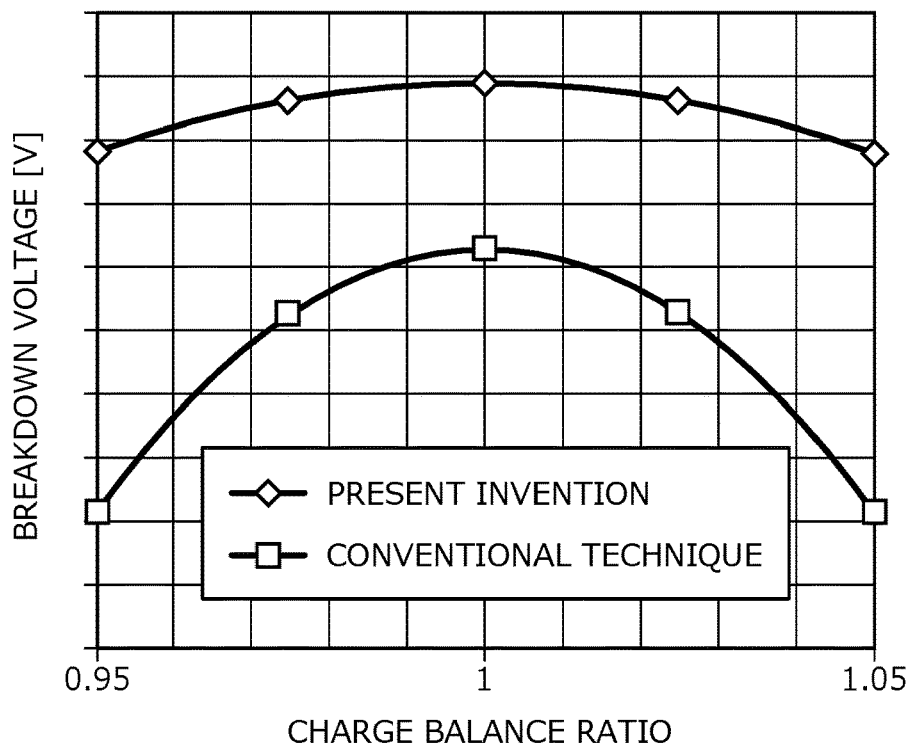
FIG. 6 is a graph depicting breakdown voltage variation with respect to charge balance of the SJ-MOSFET according to the first embodiment.

FIG. 6 is a graph depicting breakdown voltage variation with respect to charge balance of the SJ-MOSFET according to the first embodiment. In FIG. 6, a horizontal axis is charge balance ratio and a vertical axis represents breakdown voltage of the SJ-MOSFET, in units of V. The charge balance ratio is a ratio of a p-type impurity amount to an n-type impurity amount in the termination region 300 and indicates that the larger the ratio is, the greater is the p-type impurity amount.

For the SJ-MOSFET, when the charge balance ratio is 1, the breakdown voltage becomes highest, and decreases with deviation from 1. As depicted in FIG. 6, in the SJ-MOSFET according to the first embodiment, even when the charge balance ratio deviates from 1, the rate of decrease of the breakdown voltage is lower compared to the conventional SJ-MOSFET. As described, a part not conventionally used also contributes to the breakdown voltage and therefore, even when the charge balance ratio varies, the breakdown voltage does not change easily.

Figure 7:
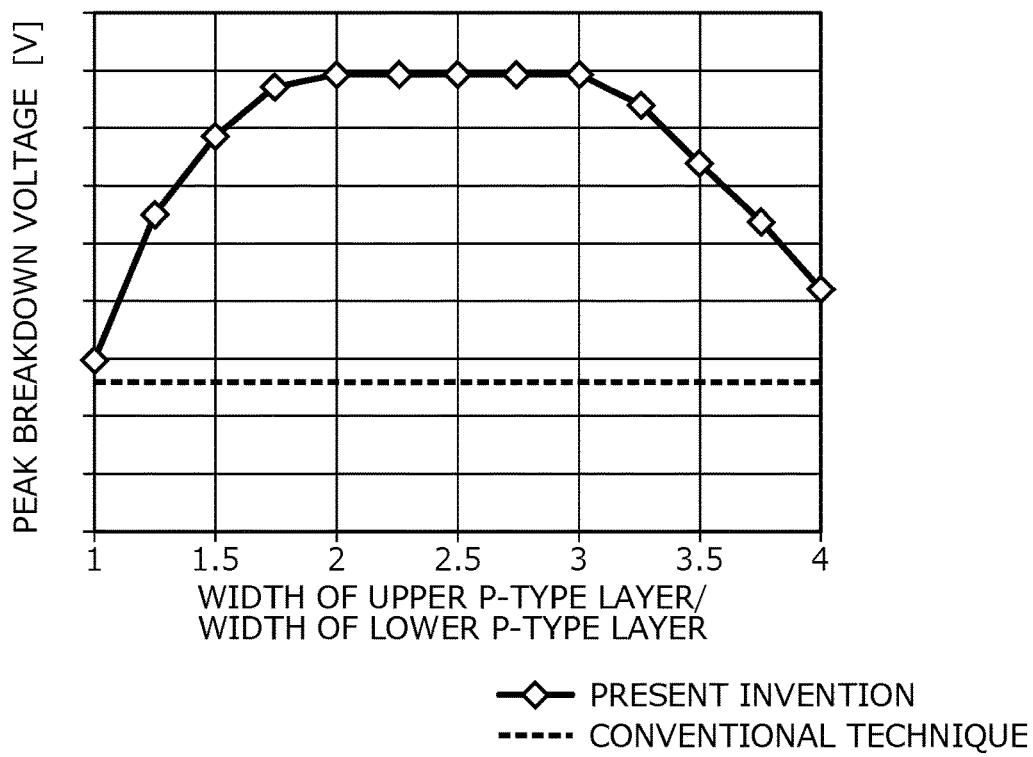
FIG. 7 is a graph depicting a relationship of peak breakdown voltage and width of an upper p-type layer/width of a lower p-type layer of the SJ-MOSFET according to the first embodiment.

FIG. 7 is a graph depicting a relationship of peak breakdown voltage and the width of the upper p-type layer/the width of the lower p-type layer of the SJ-MOSFET according to the first embodiment. In FIG. 7, a horizontal axis is a ratio of the width Wa (refer to FIG. 2) of the upper p-type layer ring 14 to the width Wc (refer to FIG. 2) of the lower p-type column region 4a; and a vertical axis indicates the breakdown voltage of the SJ-MOSFET, in units of V. As depicted in FIG. 7, the breakdown voltage of the SJ-MOSFET is constant between predetermined values of the ratio of the width Wa of the upper p-type layer ring 14/the width Wc of the lower p-type column region 4a, however, below a predetermined value or above a predetermined value, the breakdown voltage decreases. Therefore, when breakdown voltage of 1000V or higher is to be realized, the ratio of the width Wa of the upper p-type layer ring 14/the width Wc of the lower p-type column region 4a may be in a range from 1.25 to 3.

Figure 8:
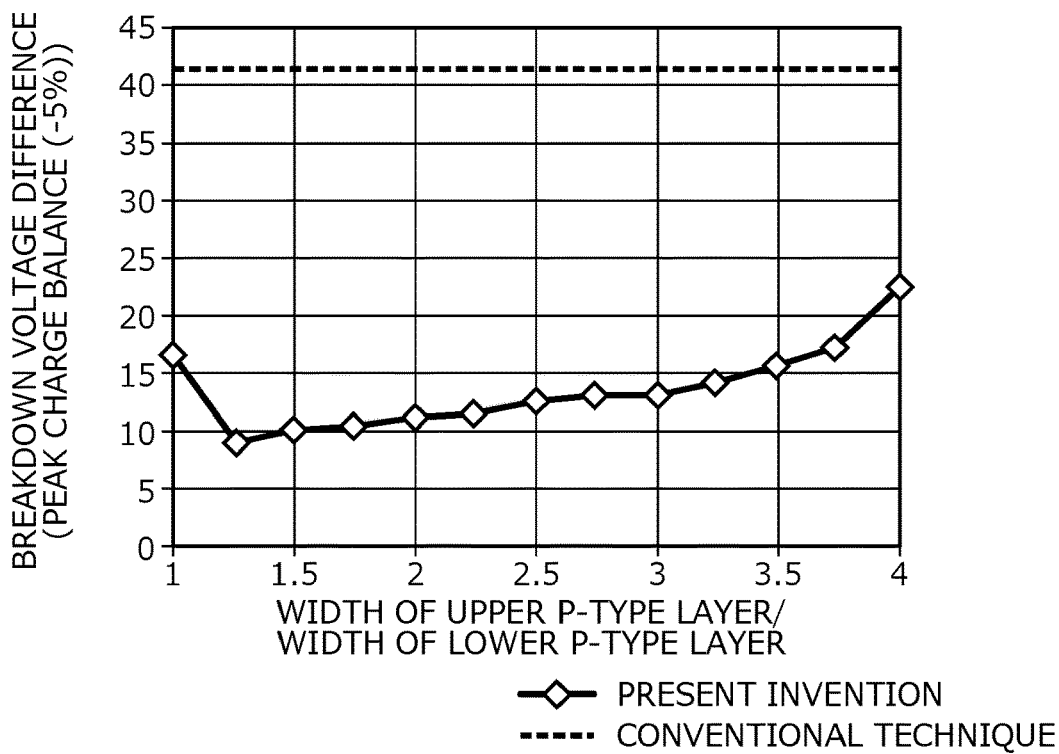
FIG. 8 is a graph depicting a relationship of breakdown voltage difference and the width of the upper p-type layer/ the width of the lower p-type layer of the SJ-MOSFET according to the first embodiment.

FIG. 8 is a graph depicting a relationship of breakdown voltage difference and the width of the upper p-type layer/the width of the lower p-type layer of the SJ-MOSFET according to the first embodiment. In FIG. 8, a horizontal axis is the ratio of the width Wa (refer to FIG. 2) of the upper p-type layer ring 14 to the width Wc (refer to FIG. 2) of the lower p-type column region 4a; and a vertical axis indicates in units of V, a breakdown voltage difference from a breakdown voltage when the peak breakdown voltage and the charge balance ratio of SJ-MOSFET is 5%. As depicted in FIG. 8, the breakdown voltage difference of the SJ-MOSFET is substantially constant between predetermined values of the ratio of the width Wa of the upper p-type layer ring 14/the width Wc of the lower p-type column region 4a, however, below a predetermined value or above a predetermined value, the breakdown voltage decreases. Therefore, when variation of the charge balance is considered, the ratio of the width Wa of the upper p-type layer ring 14/the width Wc of the lower p-type column region 4a may be in a range from 1.25 to 3.

A method of manufacturing the semiconductor device according to the first embodiment will be described. FIGS. 9, 10, 11, 12, 13, 14, and 15 are cross-sectional views of the SJ-MOSFET according to the first embodiment during manufacture. First, the $n^+$-type semiconductor substrate 1 containing silicon and constituting an $n^+$-type drain layer is prepared. Next, on a front surface of the n'-type semiconductor substrate 1, the $n^-$-type drift layer 2 having a lower impurity concentration than that of the $n^+$-type semiconductor substrate 1 is formed by epitaxial growth.

Next, on the surface of the $n^-$-type drift layer 2, by a photolithographic technique, an ion implantation mask 16a having openings of a width w1 is formed using, for example, a photoresist. Ion implantation of a p-type impurity, for example, boron (B), is performed using the ion implantation mask 16a as a mask, forming p-type ion implanted regions 17 in the surface layer of the $n^-$-type drift layer 2. The state up to here is depicted in FIG. 7. Next, the ion implantation mask 16a is removed.

Figure 10:
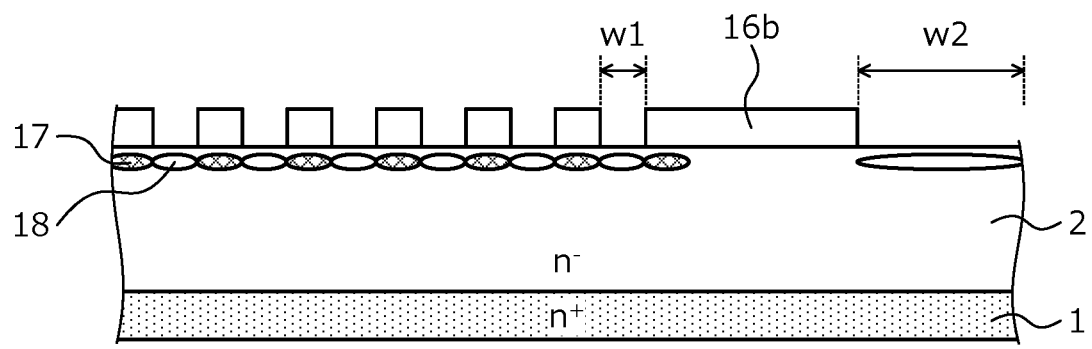
FIG. 10 is a cross-sectional view of the SJ-MOSFET according to the first embodiment during manufacture.

Next, on a surface of the $n^-$-type drift layer 2, by a photolithographic technique, an ion implantation mask 16b having the openings of the width w1 and the openings of a width w2 is formed using, for example, a photoresist. The ion implantation mask 16b is used as a mask and ion implantation of an n-type impurity, for example, phosphorus (P) is performed, forming in the surface layer of the $n^-$-type drift layer 2, an n-type ion implanted region 18. The state up to here is depicted in FIG. 10. Next, the ion implantation mask 16b is removed.

Next, on a front surface side of the $n^-$-type drift layer 2, the $n^-$-type layer 21 having an impurity concentration lower than that of the $n^-$-type drift layer 2 is formed by epitaxial growth. At this time, for example, the epitaxial growth may be performed by doping an n-type impurity so that the impurity concentration of the $n^-$-type layer 21 becomes $1.0 \times 10^{12}/cm^3$ to $1.0 \times 10^{15}/cm^3$. The state up to here is depicted in FIG. 11.

Figure 9:
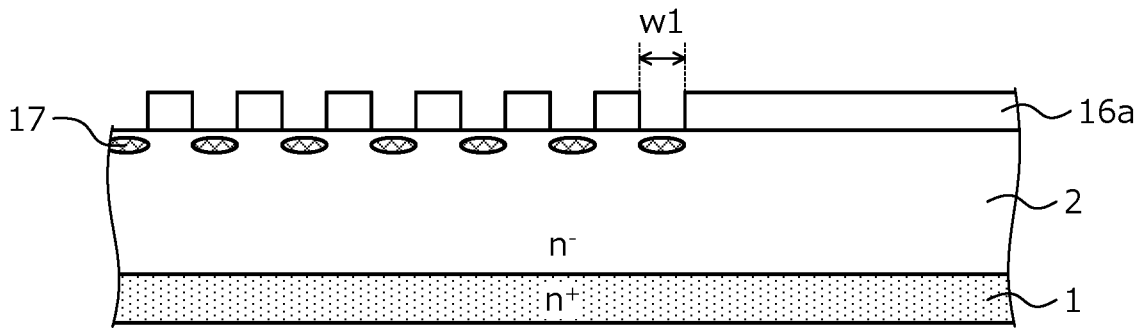
FIG. 9 is a cross-sectional view of the SJ-MOSFET according to the first embodiment during manufacture.
Figure 11:
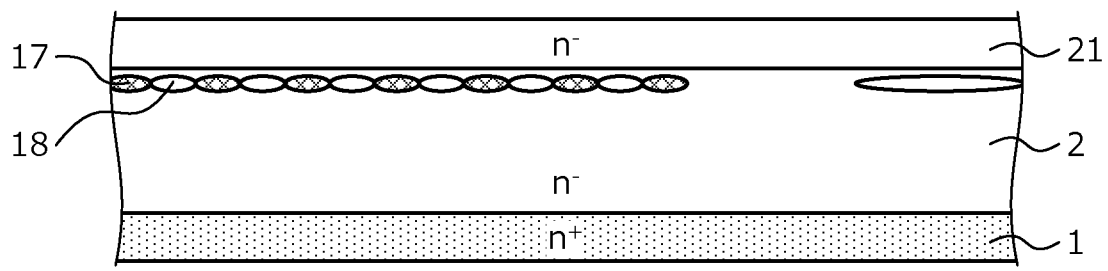
FIG. 11 is a cross-sectional view of the SJ-MOSFET according to the first embodiment during manufacture.
Figure 12:
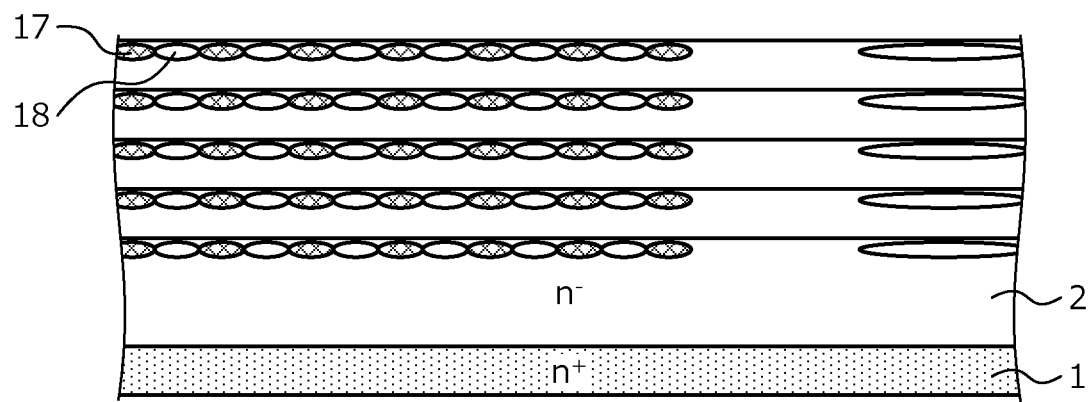
FIG. 12 is a cross-sectional view of the SJ-MOSFET according to the first embodiment during manufacture.

Next, the processes from ion implantation to epitaxial growth depicted in FIGS. 9 to 11 are repeated until thicknesses of a p-type ion implanted region 17 and the n-type ion implanted region 18 becomes the thickness of the lower n-type column regions 3a and the lower p-type column regions 4a. The state up to here is depicted in FIG. 12. In the example depicted in FIG. 12, while ion implantation and epitaxial growth are depicted to be performed 5 times, without limitation hereto, the number of times the ion implantation and epitaxial growth are performed may be suitably changed according to target characteristics such as breakdown voltage.

The lower n-type column regions 3a and the lower p-type columns region 4a, in addition to being formed by multistage ion implantation, may be formed by trenches. For example, at the front side of the n⁻-type drift layer 2, epitaxial growth for forming the n⁻-type layer 21 is performed until the thickness of the lower n-type column regions 3a and the lower p-type column regions 4a is obtained, a trench is formed at positions of the lower p-type column regions 4a, and a p-type impurity is deposited in the trench by epitaxial growth.

Next, on the surface of the n⁻-type layer 21, the n⁻-type layer 21 is formed by epitaxial growth so as to have has an impurity concentration that is lower than that of the n⁻-type drift layer 2. At this time, for example, the epitaxial growth may be performed doping an n-type impurity so that an impurity concentration of the n⁻-type layer 21 is in a range from $1.0 \times 10^{11}/cm^3$ to $1.0 \times 10^{13}/cm^3$.

Figure 13:
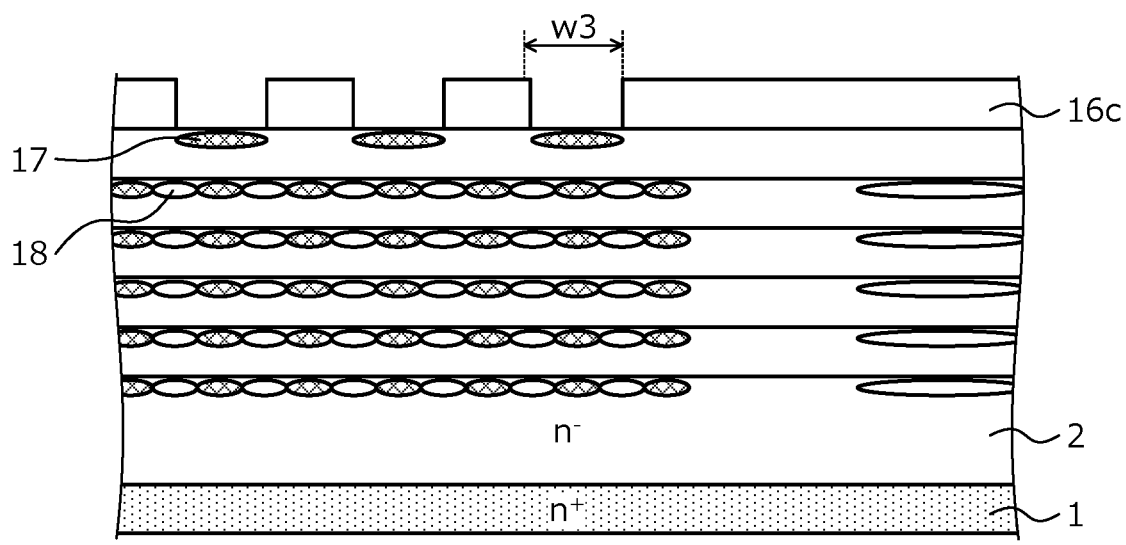
FIG. 13 is a cross-sectional view of the SJ-MOSFET according to the first embodiment during manufacture.

Next, on the surface of the n⁻-type layer 21, by a photolithographic technique, an ion implantation mask 16c having openings of a width w3 is formed using, for example, a photoresist. The width w3 is 1 to 1.2 times the width w1, a mask pitch of the openings of the width w3 is about 2 times a mask pitch of the openings of the width w1. Here, the mask pitch is a length from one opening to a subsequent opening. The ion implantation mask 16c is used as a mask and ion implantation of a p-type impurity, for example, boron, is performed, forming in the surface layer of the n⁻-type layer 21, the p-type ion implanted region 17. The state up to here is depicted in FIG. 13. Next, the ion implantation mask 16c is removed. In FIG. 13, while the processes of from epitaxial growth to ion implantation are performed 1 time to thereby form the p-type ion implanted region 17 corresponding to the thickness of the upper p-type layer ring 14, the processes of from epitaxial growth to ion implantation may be performed plural times to form the p-type ion implanted region 17.

Figure 14:
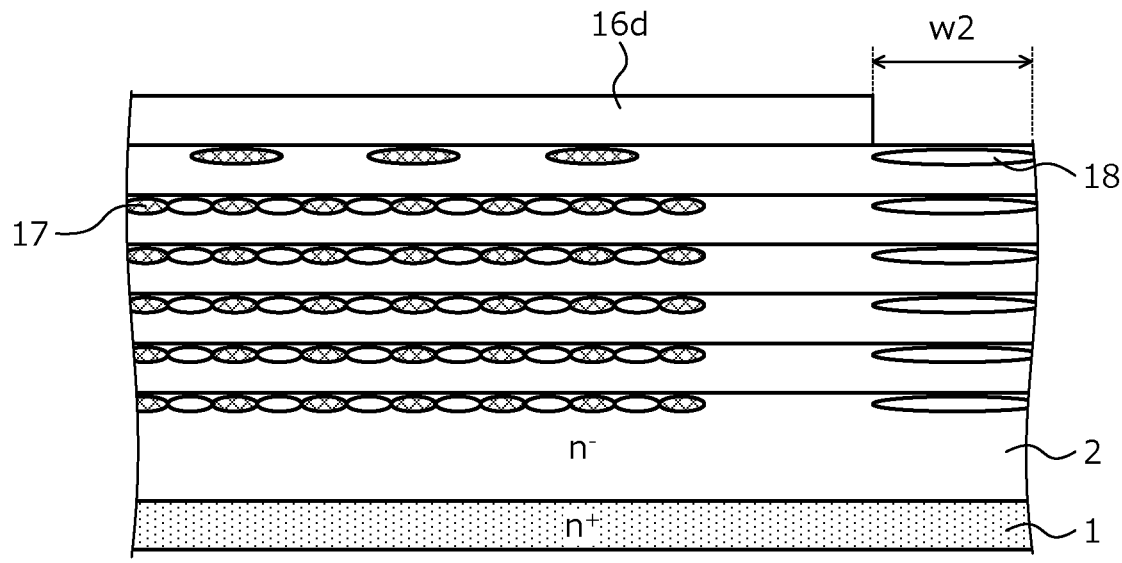
FIG. 14 is a cross-sectional view of the SJ-MOSFET according to the first embodiment during manufacture.

Next, on a surface of the n⁻-type layer 21, by a photolithographic technique, an ion implantation mask 16d having openings of the width w2 is formed using, for example, a photoresist. Ion implantation of an n-type impurity, for example, phosphorus is performed using the ion implantation mask 16d as a mask, forming the n-type ion implanted regions 18 in a surface layer of the n⁻-type layer 21. The state up to here is depicted in FIG. 14. Next, the ion implantation mask 16d is removed.

Figure 15:
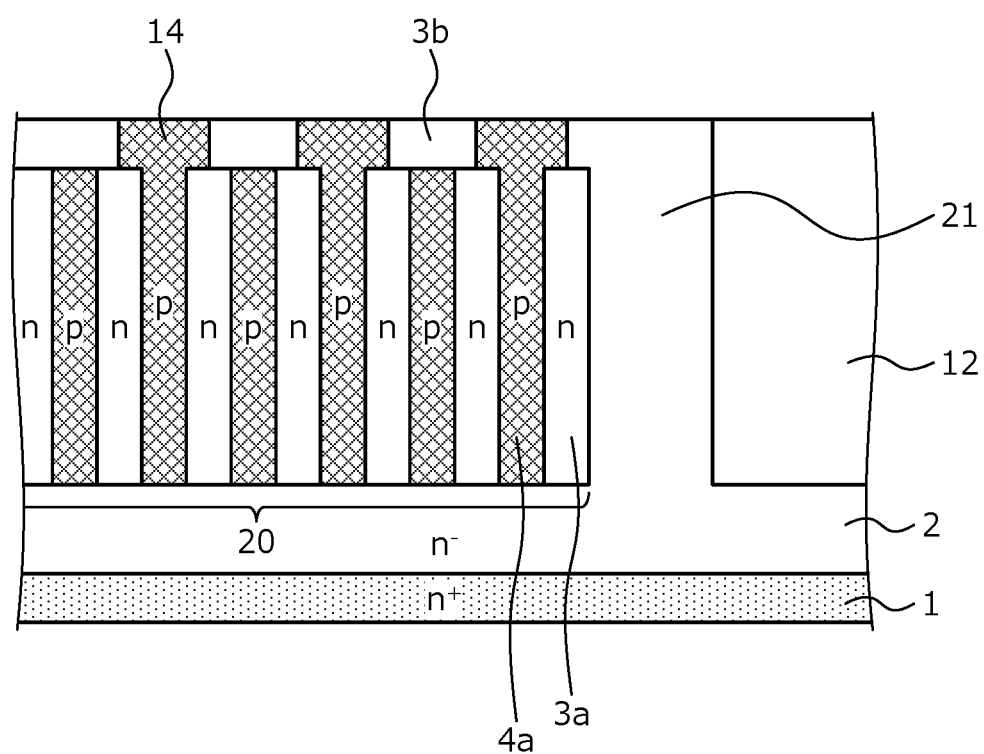
FIG. 15 is a cross-sectional view of the SJ-MOSFET according to the first embodiment during manufacture.

Next, heat treatment (annealing) for activating the p-type ion implanted region 17 and the n-type ion implanted region 18 is performed. By this heat treatment, implanted impurities are diffused, and regions with the diffused impurities are connected along a longitudinal direction, whereby the n-type column regions 3, the p-type column regions 4, the n⁺-type region 12, and the upper p-type layer rings 14 are formed. Here, the width w3 of the openings for forming the upper p-type layer ring 14 is 1 to 1.2 times the width w1 of the openings for forming the n-type column region 3 and the p-type column region 4. The impurities diffuse by the heat treatment and therefore, a width of the upper p-type layer ring 14 is 1.25 to 3.0 times the respective widths of the n-type column region 3 and the p-type column region 4. The state up to here is depicted in FIG. 15.

Thus, the parallel pn region 20 in the termination region 300 of SJ-MOSFET of the first embodiment is formed. The parallel pn region 19 in the active region 200 may be formed by the multiple ion implantations depicted in FIGS. 9 to 11 or by trenches.

Next, on surfaces of the n-type column regions 3 and the p-type column regions 4 of the active region 200, by a photolithographic technique, a mask having predetermined openings is formed using, for example, a resist. A p-type impurity is ion implanted using this resist mask as a mask, whereby in a part of a surface region of the n-type column regions 3 and a part of a surface region of the p-type column regions 4, the p⁺-type base region 5 is formed. Next, the mask used at the time of the ion implantation for forming the p⁺-type base regions 5 is removed.

Next, on a surface of the p⁺-type base regions 5, by a photolithographic technique, a mask having predetermined openings is formed using, for example, a resist. An n-type impurity is ion implanted using this resist mask as a mask, whereby in a part of a surface region of the p⁺-type base regions 5, the n⁺-type source region 6 is formed. Next, the mask used at the time of the ion implantation for forming the n⁺-type source regions 6 is removed.

Next, heat treatment (annealing) for activating the p⁺-type base regions 5 and the n⁺-type source regions 6 is performed. Further, a sequence in which the p⁺-type base region 5 and the n⁺-type source region 6 are formed may be variously changed.

Next, the upper portion of the semiconductor base is subject to thermal oxidation, forming the gate insulating film 7 and the oxide film 13. As a result, regions formed at the surface of the n⁻-type drift layer 2 in the active region 200 are covered by the gate insulating film 7.

Next, on the gate insulating film 7, as the gate electrode 8, a polycrystalline silicon layer doped with, for example, phosphorus is formed. The polycrystalline silicon layer is patterned and selectively removed, leaving the polycrystalline silicon layer on a portion of the p⁺-type base region 5 between the n⁺-type source region 6 and the n-type column region 3. At this time, the polycrystalline silicon layer may be left on the n-type column regions 3.

Next, for example, phosphorus glass (phosphosilicate glass (PSG)) is deposited as the interlayer insulating film 9 so as to cover the gate electrode 8. Next, the interlayer insulating film 9 and the gate insulating film 7 are patterned and selectively removed. For example, the gate insulating film 7 and the interlayer insulating film 9 on the n⁺-type source regions 6 are removed, forming contact holes and exposing the n⁺-type source regions 6. Next, heat treatment (reflow) for planarizing the interlayer insulating film 9 is performed.

Next, the source electrode 10 is deposited by sputtering and the source electrode 10 is patterned by photolithography and etching. At this time, the source electrode 10 is embedded in the contact holes and connected to the n⁺-type source regions 6. In the contact holes, a tungsten plug, etc. may be embedded via a barrier metal.

Next, on a surface (rear surface of the semiconductor base) of the n⁺-type semiconductor substrate 1, for example, a nickel film is deposited as the drain electrode (not depicted). Heat treatment is performed, forming an ohmic junction of the n⁺-type semiconductor substrate 1 and the drain electrode. As a result, the SJ-MOSFET depicted in FIG. 2 is completed.

Further, in the termination region 300, a field plate, RESURF, guard ring structure, etc. may be provided.

Figure 16:
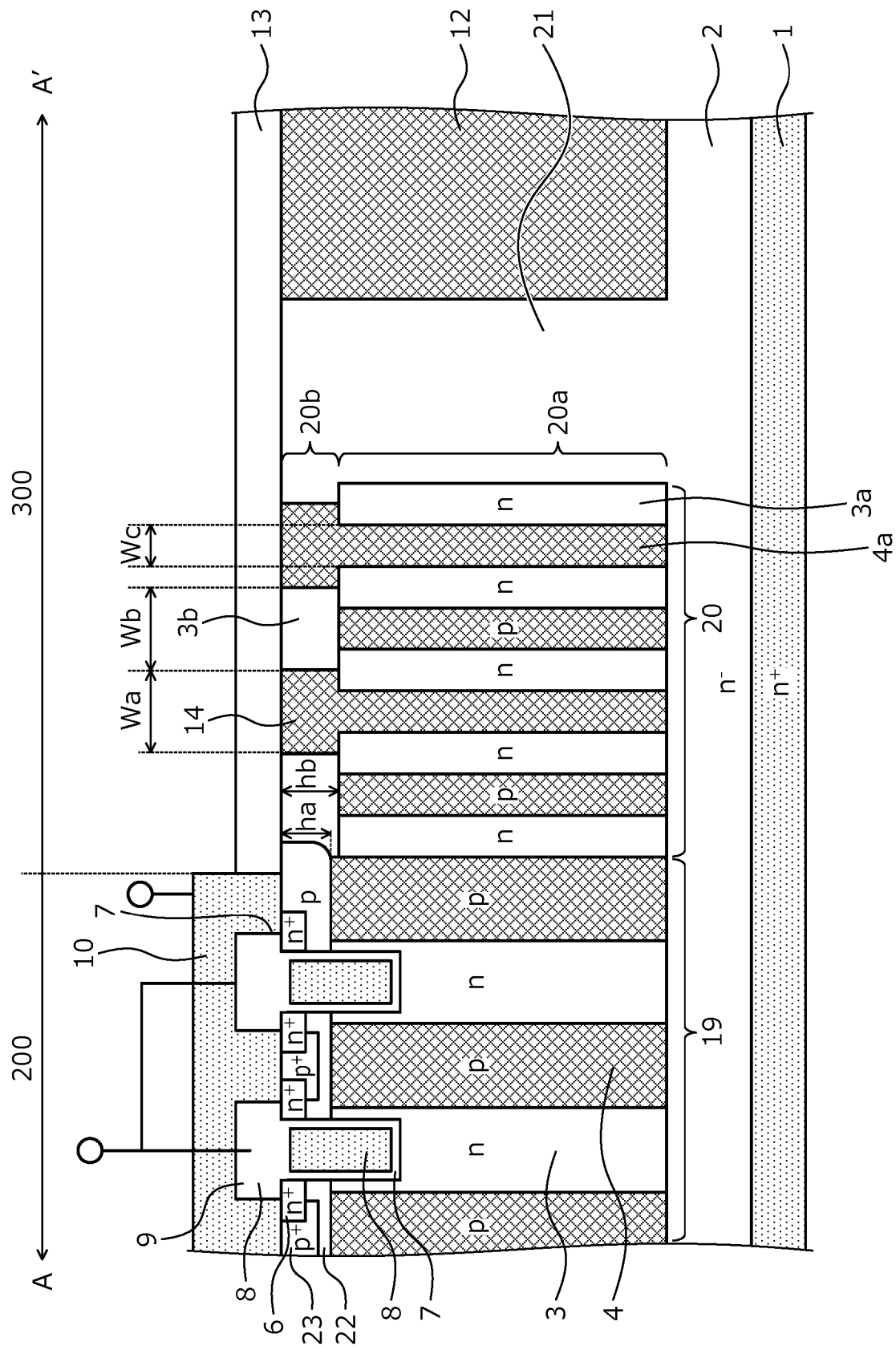
FIG. 16 is a cross-sectional view of another example of a structure of the SJ-MOSFET according to the first embodiment, at cutting line A-A' in FIG. 1.

FIG. 16 is a cross-sectional view of another example of the structure of the SJ-MOSFET according to the first embodiment, at cutting line A-A' in FIG. 1. Different from FIG. 2, a gate electrode in the active region 200 has a trench gate structure. Further, the p⁺-type base region 5 in FIG. 2 is a p-type base region 22. Further, between adjacent n⁺-type source regions 6, a p⁺-type contact region 23 is arranged. The n⁺-type source region 6 and the p⁺-type contact region 23 are electrically connected to the source electrode 10.

Even when the gate electrode 8 of the parallel pn region 19 of the active region 200 has a trench gate structure, similar effects may be obtained.

As described, according to the first embodiment, the upper parallel pn region having a wide pitch is provided in the surface layer of the parallel pn region of the termination region and a film thickness of the upper parallel pn region is greater than the film thickness of the p+-type base region. As a result, at a part of the upper parallel pn region, the n-type impurity concentration is lower than that of the conventional structure and is depleted by a lower voltage, enabling a semiconductor device to be obtained that has a termination region breakdown voltage that is higher than that conventionally.

Figure 17:
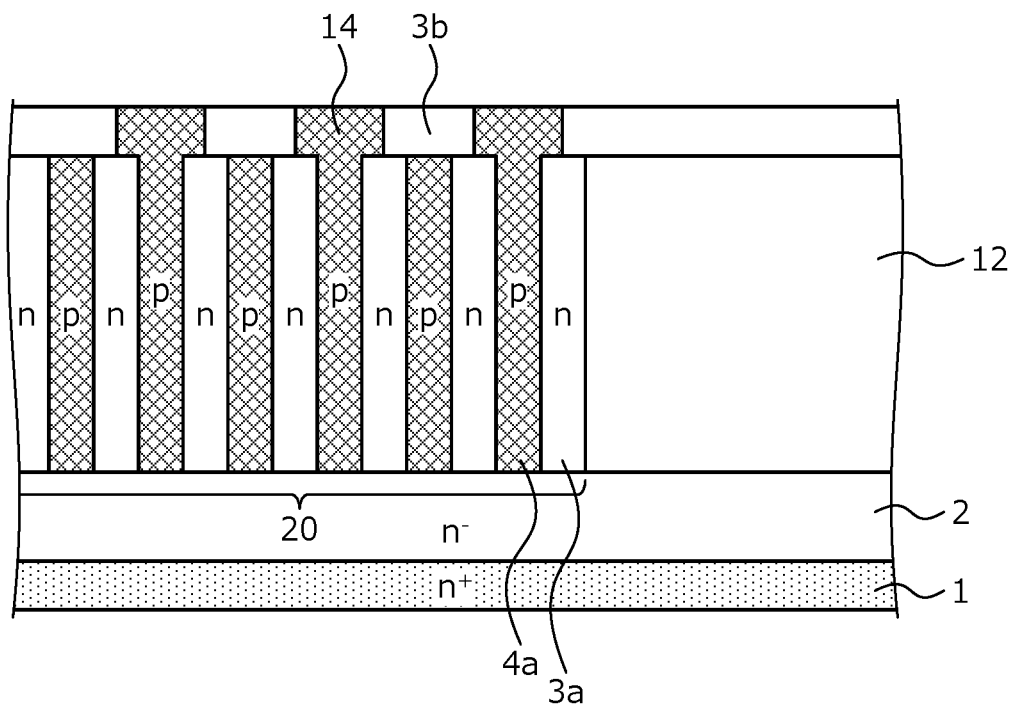
FIG. 17 is a cross-sectional view of a structure of a SJ-MOSFET according to a second embodiment.

A structure of the semiconductor device according to a second embodiment will be described. FIG. 17 is a cross-sectional view of a structure of a SJ-MOSFET according to the second embodiment. A structure of the active region 200 in the second embodiment is similar to that of the first embodiment and therefore, in FIG. 17, only the structure of the termination region 300 without the oxide film 13 is depicted.

As depicted in FIG. 17, the semiconductor device according to the second embodiment differs from the semiconductor device according to the first embodiment in that the n+-type region 12 is provided so as to surround the parallel pn region 20 and the n−-type layer 21 is not provided.

A method of manufacturing the semiconductor device according to the second embodiment will be described. FIGS. 18, 19, 20, 21, 22, and 23 are cross-sectional views of a SJ-MOSFET according to the second embodiment during manufacture. First, similarly to the first embodiment, the n+-type semiconductor substrate 1 containing silicon and constituting the n+-type drain layer is prepared. Next, on a front surface of the n+-type semiconductor substrate 1, the n−-type drift layer 2 having a lower impurity concentration than that of the n+-type semiconductor substrate 1 is formed by epitaxial growth.

Figure 18:
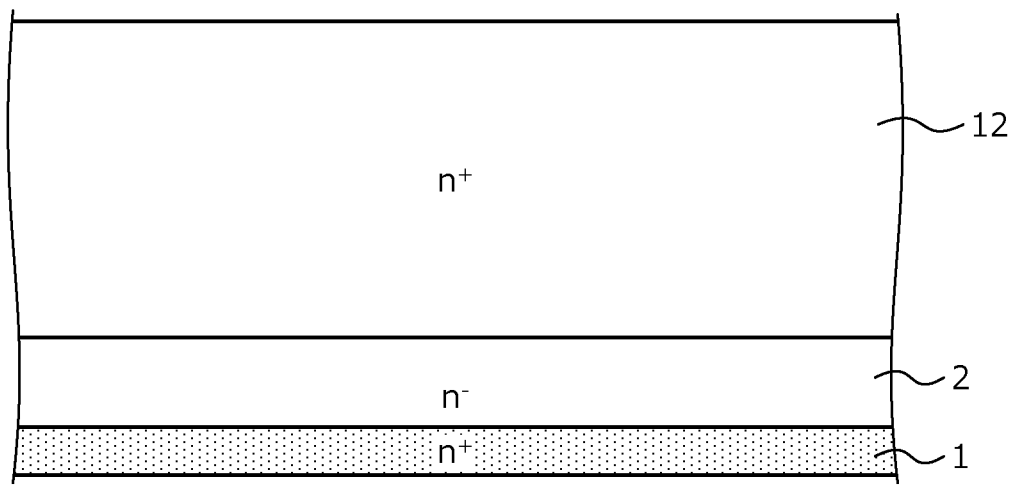
FIG. 18 is a cross-sectional view of the SJ-MOSFET according to the second embodiment during manufacture.

Next, on the front surface of the n−-type drift layer 2, the n+-type region 12 having an impurity concentration higher than that of the n−-type drift layer 2 is formed by epitaxial growth to have a thickness equal the thickness of the lower n-type column regions 3a and the lower p-type column regions 4a. At this time, for example, the epitaxial growth may be performed with doping of an n-type impurity so that the impurity concentration of the n+-type region 12 is in a range from $10 \times 10^{14}/cm^3$ to $10 \times 10^{16}/cm^3$. The state up to here is depicted in FIG. 18.

Figure 19:
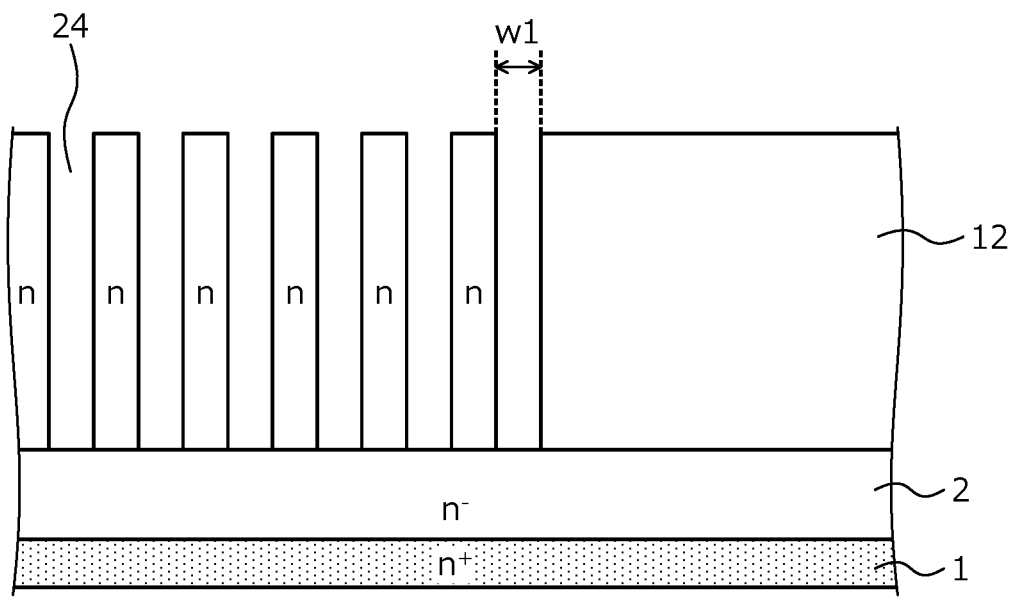
FIG. 19 is a cross-sectional view of the SJ-MOSFET according to the second embodiment during manufacture.

Next, on the surface of the n+-type region 12, by a photolithographic technique, a non-depicted mask having openings of the width w1 is formed using, for example, an oxide film. Subsequently, embedded trenches 24 are formed penetrating the n+-type region 12 and reaching the n−-type drift layer 2, by dry etching using the oxide film is used as a mask. Subsequently, the mask used for forming the embedded trenches 24 is removed. The state up to here is depicted in FIG. 19.

Figure 20:
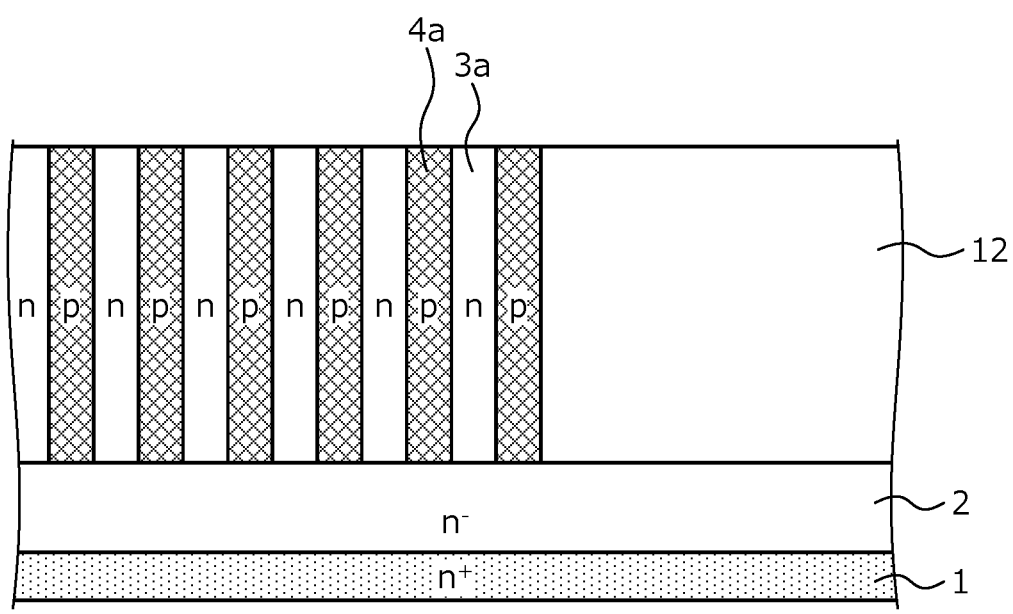
FIG. 20 is a cross-sectional view of the SJ-MOSFET according to the second embodiment during manufacture.

Next, in the embedded trenches 24, a p-type impurity is embedded whereby the lower p-type column regions 4a are formed by epitaxial growth and thereafter, the surfaces of the lower p-type column regions 4a are ground until becoming a same height as the surface of the n+-type region 12. The impurity concentration of the lower p-type column regions 4a is determined so as to maintain the charge balance of the p-type regions and the n-type regions. For example, the epitaxial growth may be performed with doping of a p-type impurity so that the impurity concentration of the lower p-type column regions 4a is in a range from $1.0 \times 10^{14}/cm^3$ to $1.0 \times 10^{16}/cm^3$. The state up to here is depicted in FIG. 20.

Figure 21:
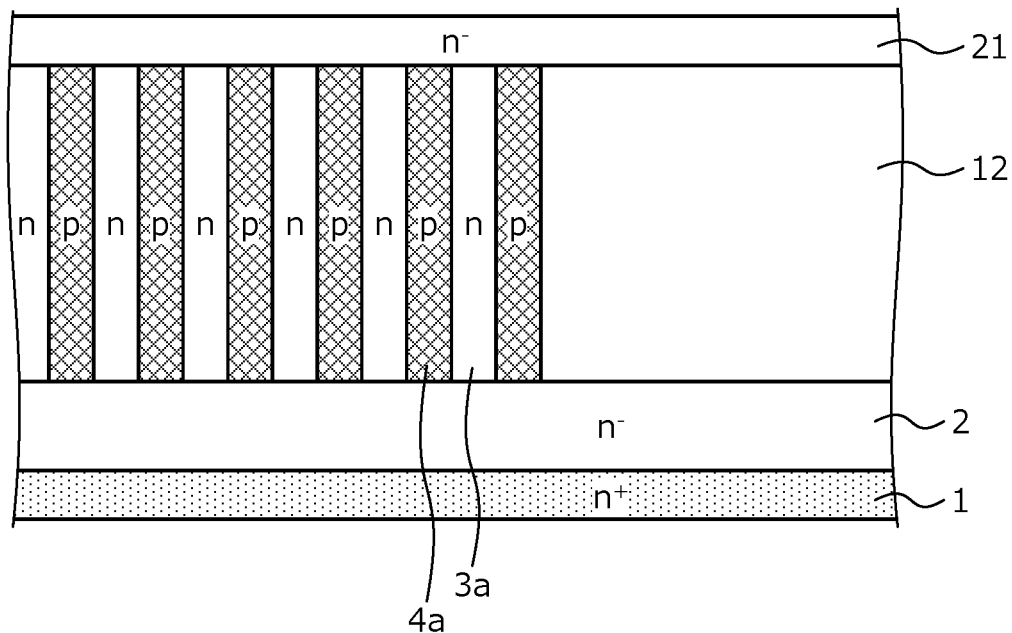
FIG. 21 is a cross-sectional view of the SJ-MOSFET according to the second embodiment during manufacture.

Next, on the surfaces of the lower p-type column regions 4a and the n+-type region 12, the n−-type layer 21 having an impurity concentration lower than that of the n−-type drift layer 2 is formed by epitaxial growth. At this time, for example, the epitaxial growth may be performed with doping of an n−-type layer 21 so that the impurity concentration is in a range from $1.0 \times 10^{11}/cm^3$ to $1.0 \times 10^{13}/cm^3$. The state up to here is depicted in FIG. 21.

Figure 22:
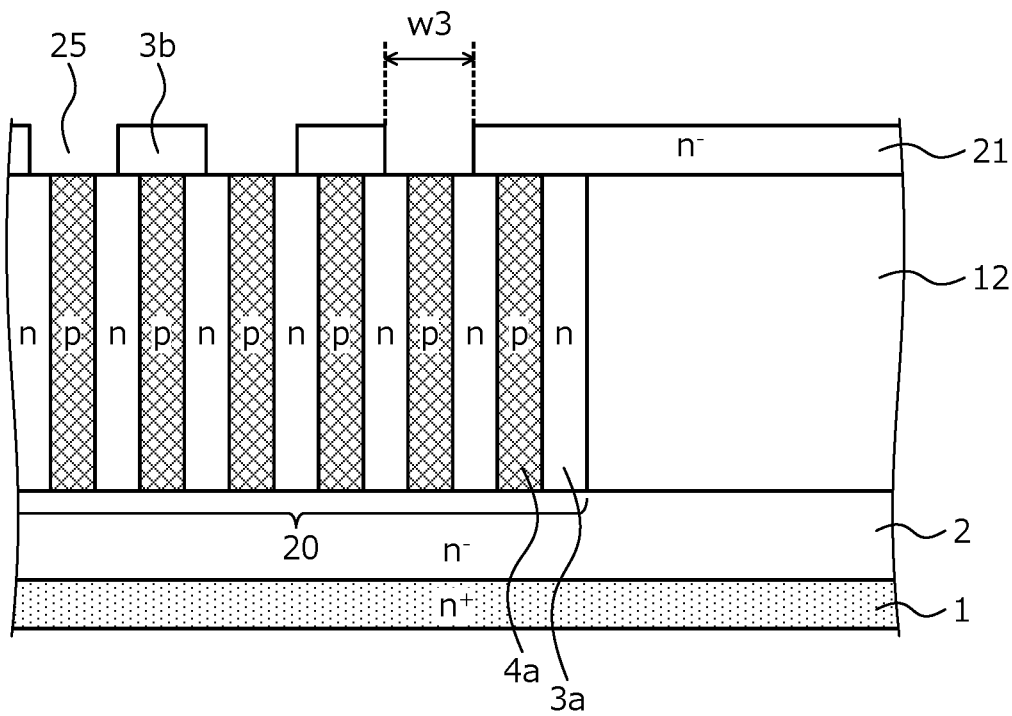
FIG. 22 is a cross-sectional view of the SJ-MOSFET according to the second embodiment during manufacture.

Next, on the surface of the n−-type layer 21, by a photolithographic technique, a non-depicted mask having openings of the width w3 is formed using, for example, an oxide film. Subsequently, embedded trenches 25 are formed penetrating the n−-type layer 21 and reaching the n+-type region 12, by dry etching using the oxide film as a mask. Subsequently, the mask used for forming the embedded trenches 25 is removed. The state up to here is depicted in FIG. 22.

Figure 23:
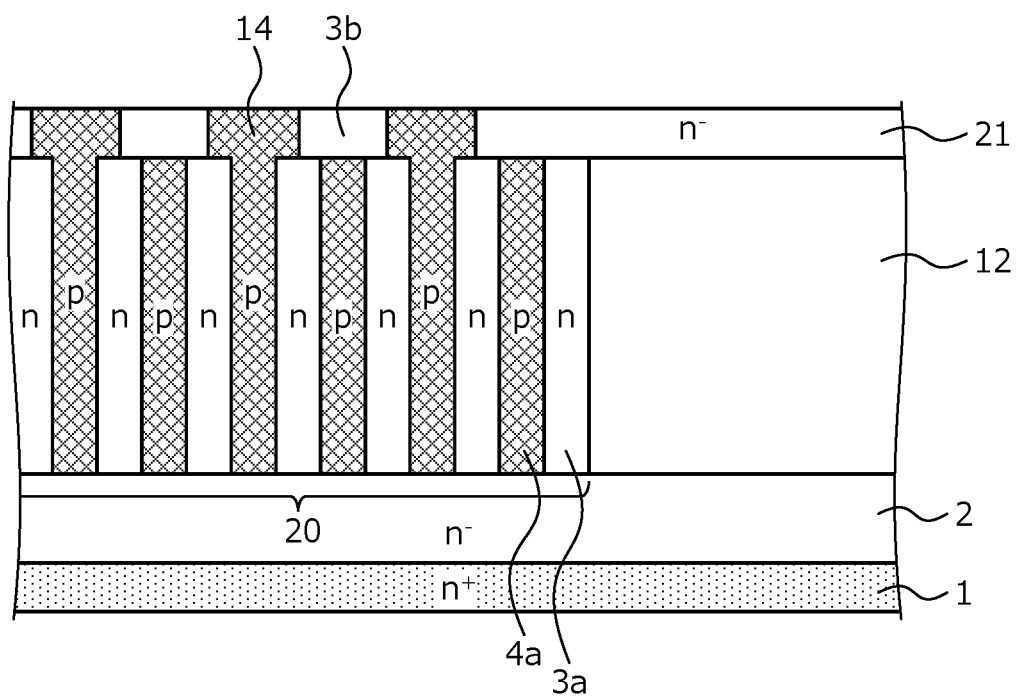
FIG. 23 is a cross-sectional view of the SJ-MOSFET according to the second embodiment during manufacture.
Figure 24:
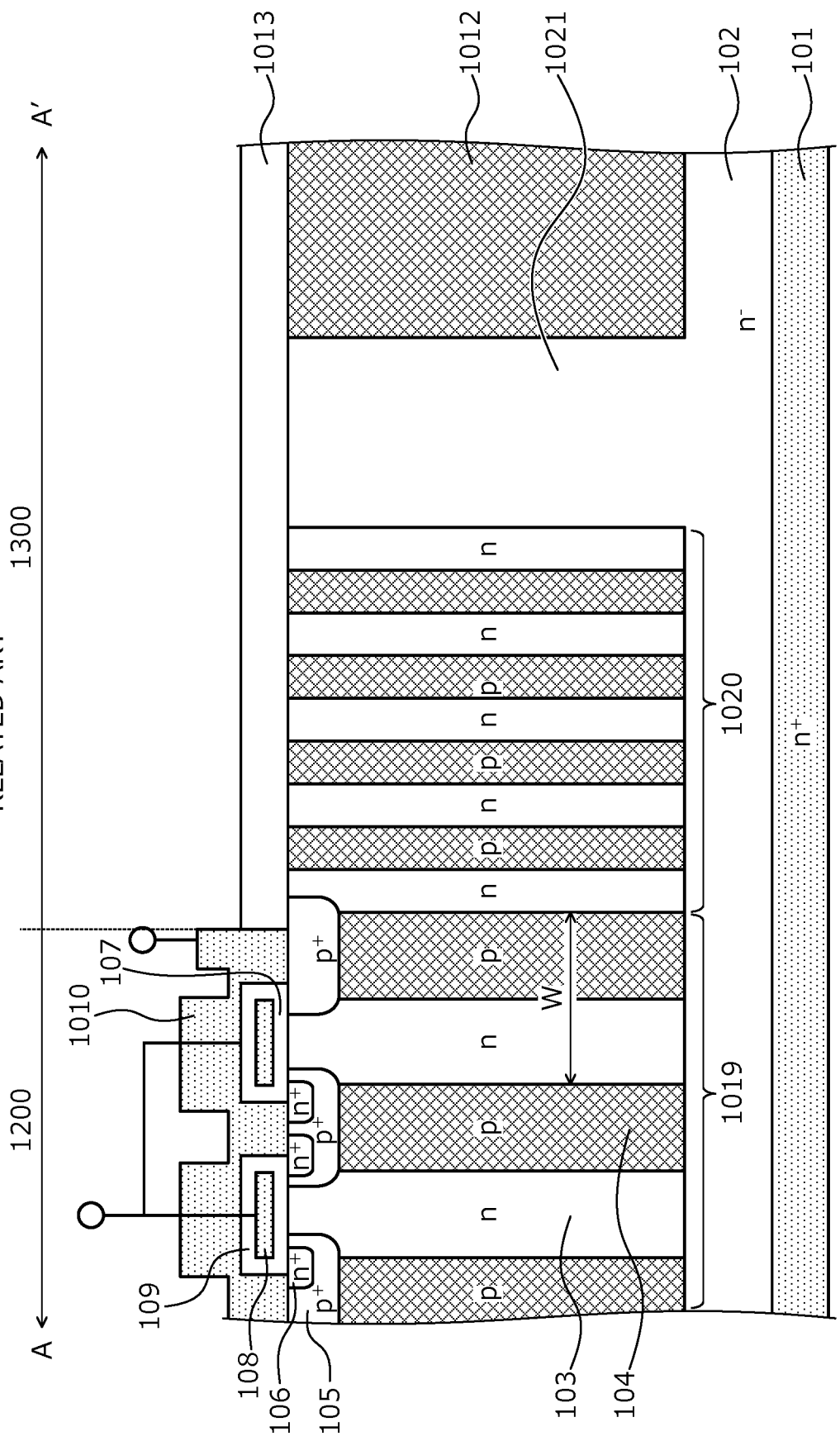
FIG. 24 is a cross-sectional view of a structure f a conventional SJ-MOSFET at cutting line A-A' in FIG. 25.
Figure 25:
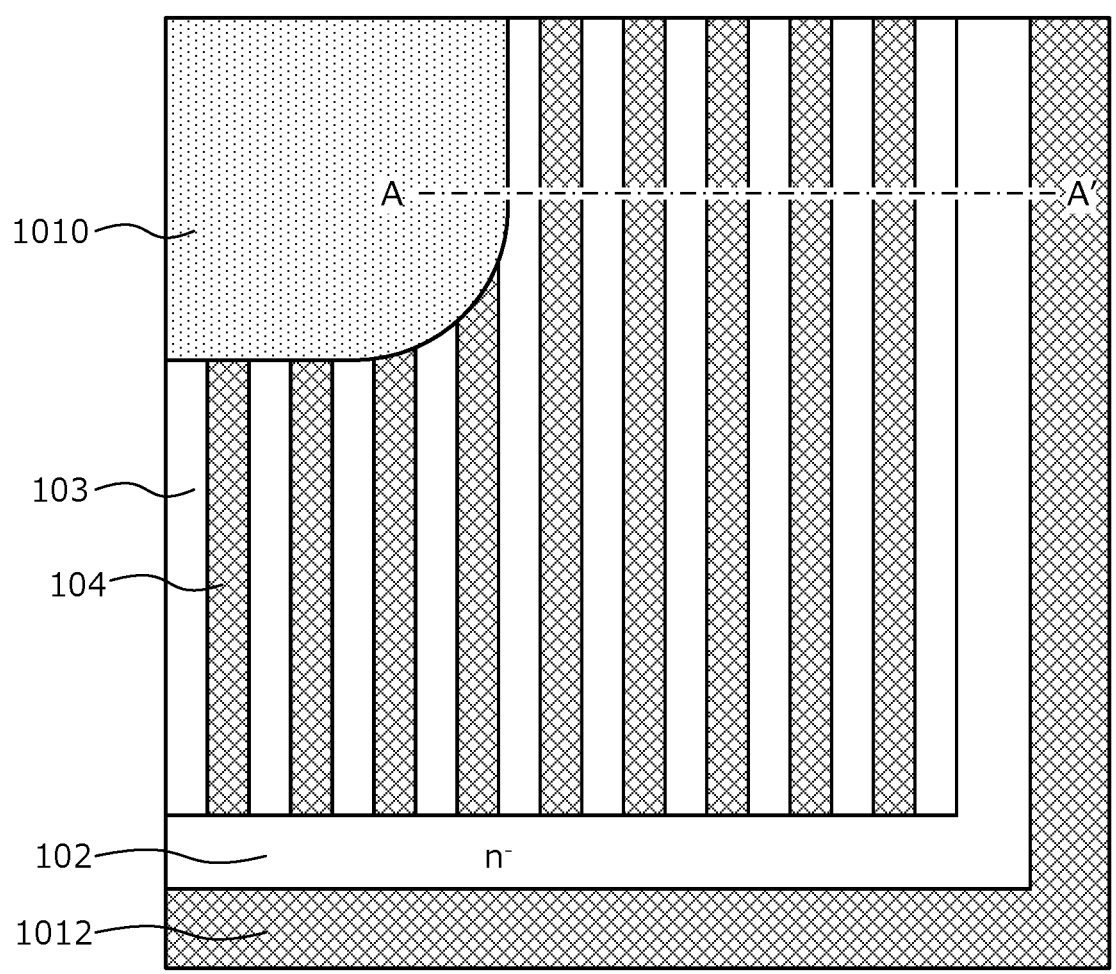
FIG. 25 is a top view of the structure of the conventional SJ-MOSFET.

Next, a p-type impurity is embedded in the embedded trenches 25, whereby the upper p-type layer rings 14 are formed by epitaxial growth and thereafter, the surfaces the upper p-type layer rings 14 are ground until becoming a same height as the surface of the n−-type layer 21, The impurity concentration of the upper p-type layer rings 14 are determined so as to maintain the charge balance of the p-type regions and the n-type regions. For example, the epitaxial growth may be performed with doping of a p-type impurity so that the impurity concentration of the upper p-type layer rings 14 is in a range from $1.0 \times 10^{14}/cm^3$ to $1.0 \times 10^{16}/cm^3$. The state up to here is depicted in FIG. 23.

As described, the parallel pn region 20 in the termination region 300 of the SJ-MOSFET according to the second embodiment is formed. Further, the parallel pn region 20 may also be formed by repeated ion implantation and epitaxial growth as in the first embodiment. The parallel pn region 19 in the active region 200 may also be formed by trenches or multistage ion implantation as depicted in FIGS. 9 to 11. Thereafter, processes similar to those of the first embodiment are performed, whereby the SJ-MOSFET depicted in FIG. 17 is completed.

Further, in the second embodiment as well, the gate electrode in the active region 200 may have a trench structure. Values of the width Wa of the upper p-type layer rings 14, the interval Wb between the upper p-type layer rings 14, the width Wc of the lower p-type column regions 4a, the film thickness hb of the upper parallel pn region 20b, the film thickness ha of the p+-type base region 5 may be the same values as those in the first embodiment.

As described, according to the second embodiment, the upper parallel pn region having a wide pitch is provided in the surface layer of the parallel pn region of the termination region and the film thickness of the upper parallel pn region is thicker than the film thickness of the p+-type base region. As a result, the semiconductor device having effects similar to those of the first embodiment and a breakdown voltage of the termination region higher than that conventionally may be obtained.

In the embodiments of the present invention, although case in which a MOS gate structure is configured on a first main surface of a silicon substrate has been described as an example, without limitation hereto, various changes are possible such as a type of semiconductor material (for example, silicon carbide (SiC) or the like), orientation of the substrate main surface, etc. Further, in the embodiments of the present invention, although the first conductivity type is assumed to be an n-type and a second conductivity type is assumed to a p-type, the present invention is similarly implemented when the first conductivity type is a p-type and the second conductivity type is an n-type.

According to the embodiments of the present invention, the upper parallel pn region having a wide pitch is provided in the surface layer of the parallel pn region of the termination region and the film thickness of the upper parallel pn region is thicker than the film thickness of the p$^+$-type base region (first semiconductor region of the second conductivity type). As a result, the semiconductor device having an n-type impurity concentration at a part of the upper parallel pn region lower than that conventionally, depleting at a lower voltage, and having a higher breakdown voltage of the termination region may be obtained.

The semiconductor device and the method of manufacturing a semiconductor device according to the embodiments of the present invention achieve an effect in that without increasing the length of the termination region (without increasing the mathematical area of the termination region), the breakdown voltage of the termination region may be easily made higher than the breakdown voltage of the active region.

As described, the semiconductor device and the method of manufacturing a semiconductor device according to the present invention are useful for a high-voltage semiconductor device used in power converting equipment and in power supply devices of various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device including an active region through which current flows and a termination structure region disposed outside the active region and in which a termination structure is provided surrounding a periphery of the active region, the method comprising:
   forming a first semiconductor layer of a first conductivity type on a front surface of a semiconductor substrate of the first conductivity type, the first semiconductor layer having an impurity concentration that is lower than an impurity concentration of the semiconductor substrate;
   forming a lower parallel pn structure at a surface of the first semiconductor layer and in which a lower first column of the first conductivity type and a lower second column of a second conductivity type are disposed to alternate repeatedly in a plane parallel to the front surface;
   forming an upper parallel pn structure at a surface of the lower parallel pn structure in the termination structure region and in which an upper first column of the first conductivity type and an upper second column of the second conductivity type are electrically connected with the lower second column and are disposed to alternate repeatedly in a plane parallel to the front surface; and
   forming a first semiconductor region of the second conductivity type at a surface of the lower parallel pn structure in the active region,
   wherein
   forming the upper parallel pn structure includes forming a lower surface of the upper first column at least partially in contact with upper surfaces of adjacent lower first columns, forming the upper second column to have a width wider than a width of the lower second column, forming adjacent upper second columns spaced apart from each other at an interval which is wider than an interval at which adjacent lower second columns are spaced apart from each other, and forming the upper second column to have a thickness thicker than a thickness of the first semiconductor region,
   the thickness of the upper second column is a distance from an upper surface of the upper second column to a lower surface of the upper second column which is at least partially in contact with the upper surfaces of adjacent lower first columns, and
   the thickness of the first semiconductor region is a distance from an upper surface of the first semiconductor region to a lower surface of the first semiconductor region which is in contact with the surface of the lower parallel pn structure in the active region.

2. The method according to claim 1, wherein
   forming the lower parallel pn structure includes forming the lower parallel pn structure by repeatedly performing epitaxial growth and ion implantation, and
   forming the upper parallel pn structure includes forming the upper parallel pn structure by repeatedly performing epitaxial growth and ion implantation.

3. The method according to claim 1, wherein
   forming the lower parallel pn structure includes forming the lower parallel pn structure by forming a trench and embedding an impurity of the first conductivity type or the second conductivity type in the trench, and
   forming the upper parallel pn structure includes forming the upper parallel pn structure by forming a trench and embedding an impurity of the first conductivity type or the second conductivity type in the trench.

4. The method according to claim 1, wherein
   forming the upper parallel pn structure includes using a mask having openings of a width that is 1 time to 1.2 times a width of openings of a mask used in forming the lower parallel pn structure.

\* \* \* \* \*